(12) United States Patent
Shue et al.

(10) Patent No.: US 12,040,289 B2
(45) Date of Patent: Jul. 16, 2024

(54) INTERPOSER INCLUDING A COPPER EDGE SEAL RING STRUCTURE AND METHODS OF FORMING THE SAME

(71) Applicant: Taiwan Semiconductor Manufacturing Company Limited, Hsinchu (TW)

(72) Inventors: Hong-Seng Shue, Hsinchu (TW); Ming-Da Cheng, Taoyuan (TW); Ching-Wen Hsiao, Hsinchu (TW); Yao-Chun Chuang, Hsinchu (TW); Yu-Tse Su, Chiayi (TW); Chen-Shien Chen, Zhubei (TW)

(73) Assignee: Taiwan Semiconductor Manufacturing Company Limited, Hsinchu (TW)

( * ) Notice: Subject to any disclaimer, the term of this patent is extended or adjusted under 35 U.S.C. 154(b) by 303 days.

(21) Appl. No.: 17/412,530

(22) Filed: Aug. 26, 2021

(65) Prior Publication Data

US 2023/0065794 A1 Mar. 2, 2023

(51) Int. Cl.
*H01L 23/58* (2006.01)
*H01L 21/48* (2006.01)
(Continued)

(52) U.S. Cl.
CPC ........ *H01L 23/585* (2013.01); *H01L 21/4853* (2013.01); *H01L 21/4857* (2013.01);
(Continued)

(58) Field of Classification Search
CPC .............. H01L 23/585; H01L 21/4853; H01L 21/4857; H01L 23/49816; H01L 23/49822;
(Continued)

(56) References Cited

U.S. PATENT DOCUMENTS

2017/0084561 A1*  3/2017  Seo .................... H01L 24/05
2017/0110421 A1*  4/2017  Liu .................... H01L 25/50
(Continued)

FOREIGN PATENT DOCUMENTS

TW   202042357 A   11/2020
TW   202046457 A   12/2020

OTHER PUBLICATIONS

Taiwan Patent and Trademark Office, TW Application No. 111121924, Notice dated Jun. 27, 2023; 4 pages.

*Primary Examiner* — Evan G Clinton
(74) *Attorney, Agent, or Firm* — The Marbury Law Group, PLLC

(57) ABSTRACT

An organic interposer includes interconnect-level dielectric material layers embedding redistribution interconnect structures, package-side bump structures located on a first side of the interconnect-level dielectric material layers, at least one dielectric capping layer located on a second side of the interconnect-level dielectric material layers, a bonding-level dielectric layer located on the at least one dielectric capping layer, metallic pad structures including pad via portions embedded in the at least one dielectric capping layer and pad plate portions embedded in the bonding-level dielectric layer, and an edge seal ring structure vertically extending from a first horizontal plane including bonding surfaces of the package-side bump structures to a second horizontal plane including distal planar surfaces of the metallic pad structures. The edge seal ring structure may include a vertical stack of metallic ring structures that are free of aluminum and laterally surround the package-side bump structures and the redistribution interconnect structures.

20 Claims, 22 Drawing Sheets

(51) Int. Cl.
*H01L 23/00* (2006.01)
*H01L 23/498* (2006.01)
(52) U.S. Cl.
CPC .. *H01L 23/49816* (2013.01); *H01L 23/49822* (2013.01); *H01L 24/16* (2013.01); *H01L 2224/16227* (2013.01)
(58) Field of Classification Search
CPC ........... H01L 24/16; H01L 2224/16227; H01L 23/5383; H01L 23/3114; H01L 23/49838; H01L 23/5385; H01L 23/564; H01L 25/0655; H01L 2224/13082; H01L 2224/16225; H01L 2224/32225; H01L 2224/73204; H01L 2224/81193; H01L 2224/92125; H01L 2924/15311; H01L 2924/181; H01L 2924/18161; H01L 21/4846; H01L 23/31; H01L 23/49827
See application file for complete search history.

(56) References Cited

U.S. PATENT DOCUMENTS

| | | | |
|---|---|---|---|
| 2018/0151540 A1* | 5/2018 | Yu | H01L 23/49827 |
| 2020/0135664 A1* | 4/2020 | Tseng | H01L 21/02013 |
| 2021/0202360 A1 | 7/2021 | Hsu et al. | |
| 2021/0225664 A1 | 7/2021 | Wu et al. | |
| 2022/0189861 A1* | 6/2022 | Aleksov | H01L 23/562 |

* cited by examiner

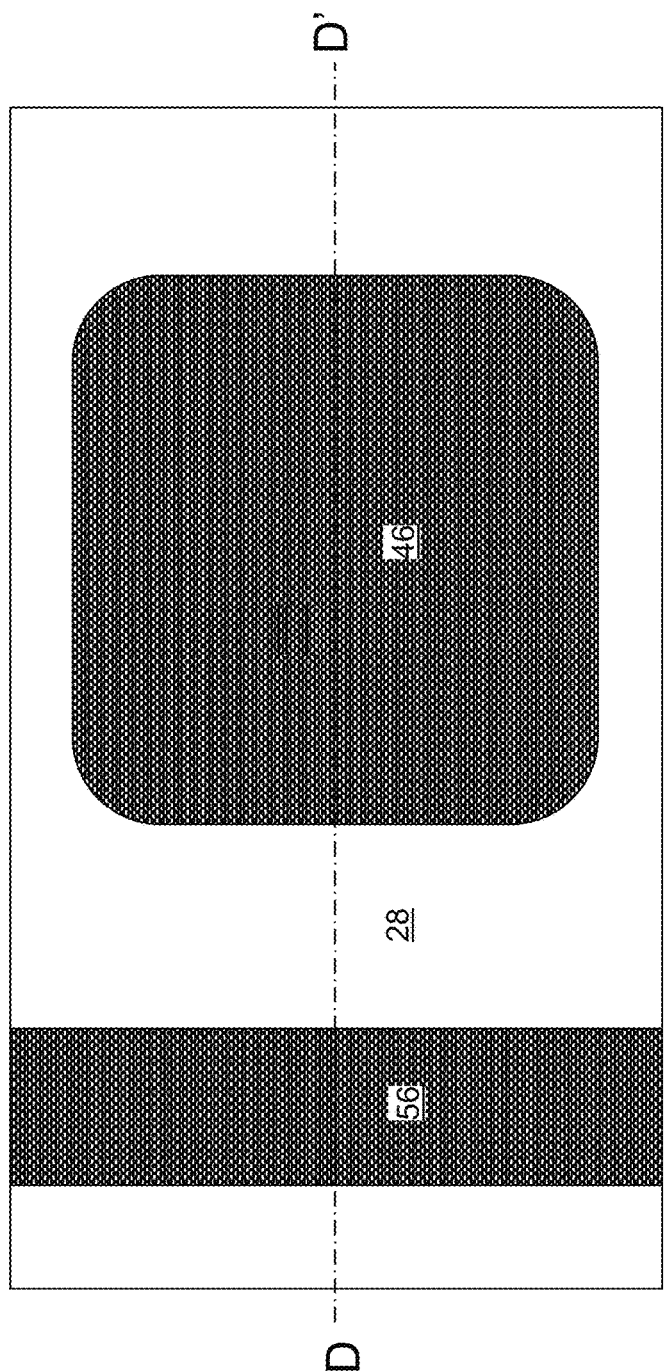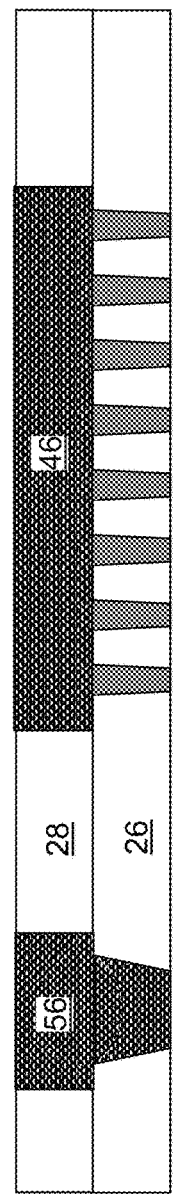

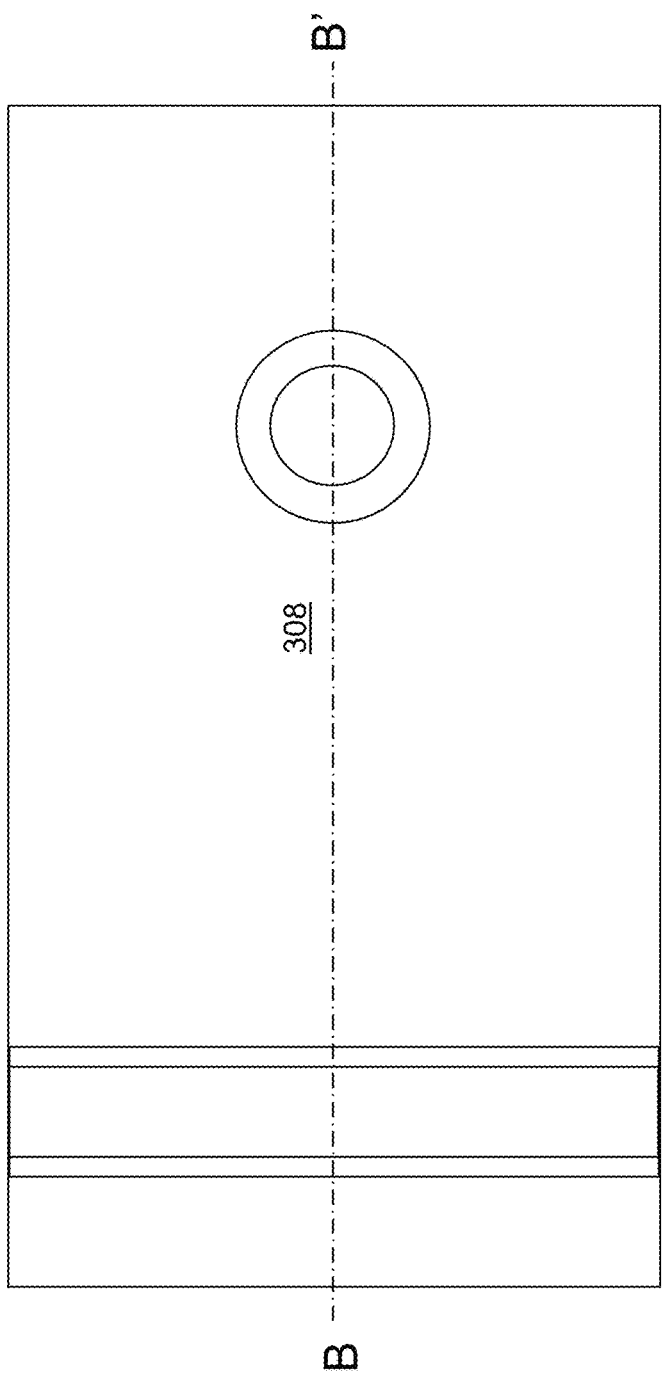
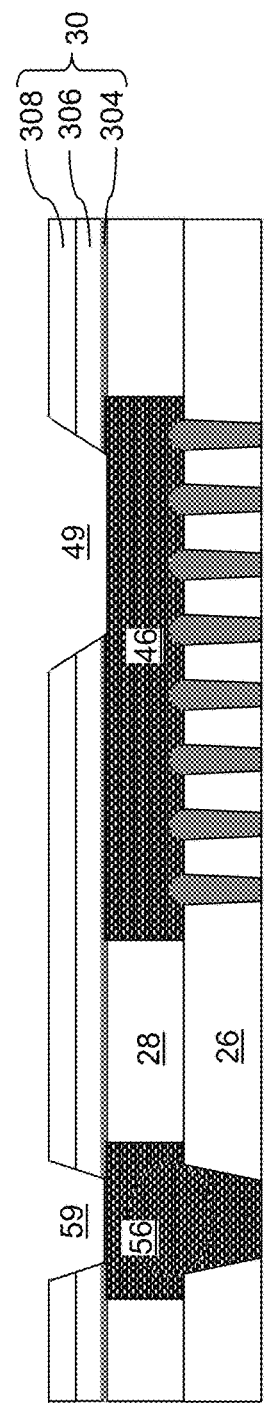
FIG. 3A
FIG. 3B

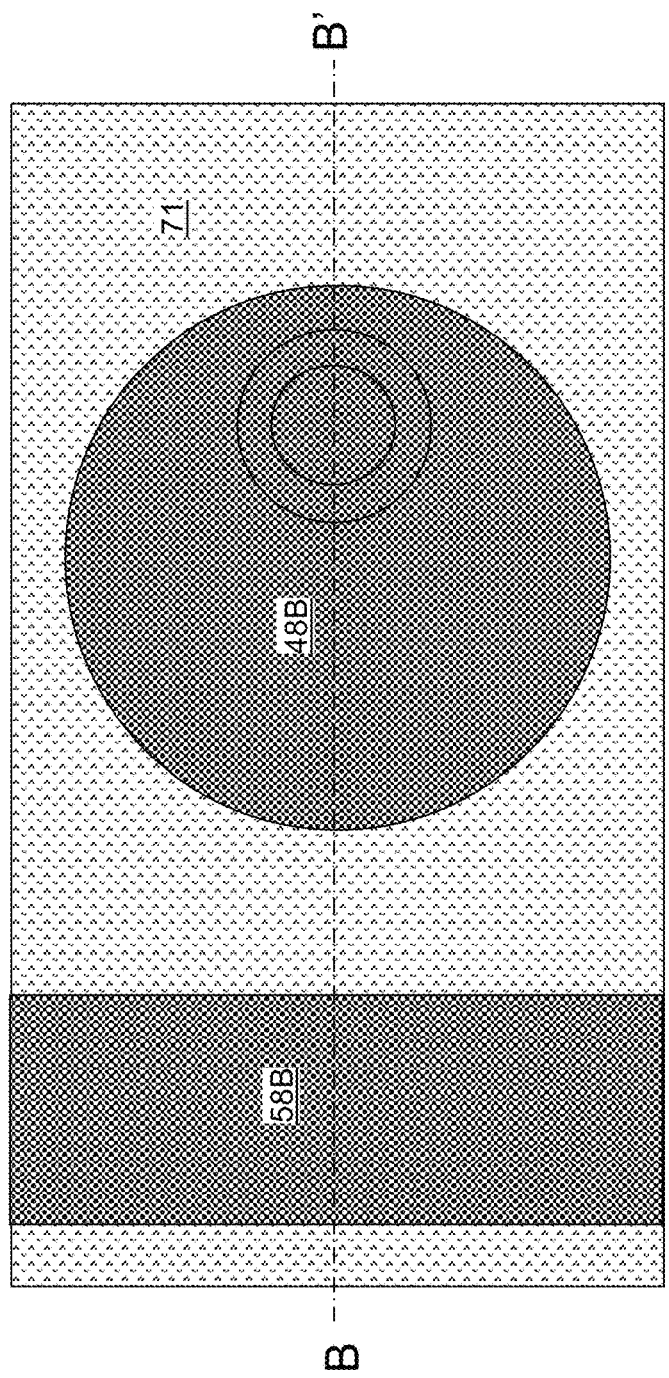
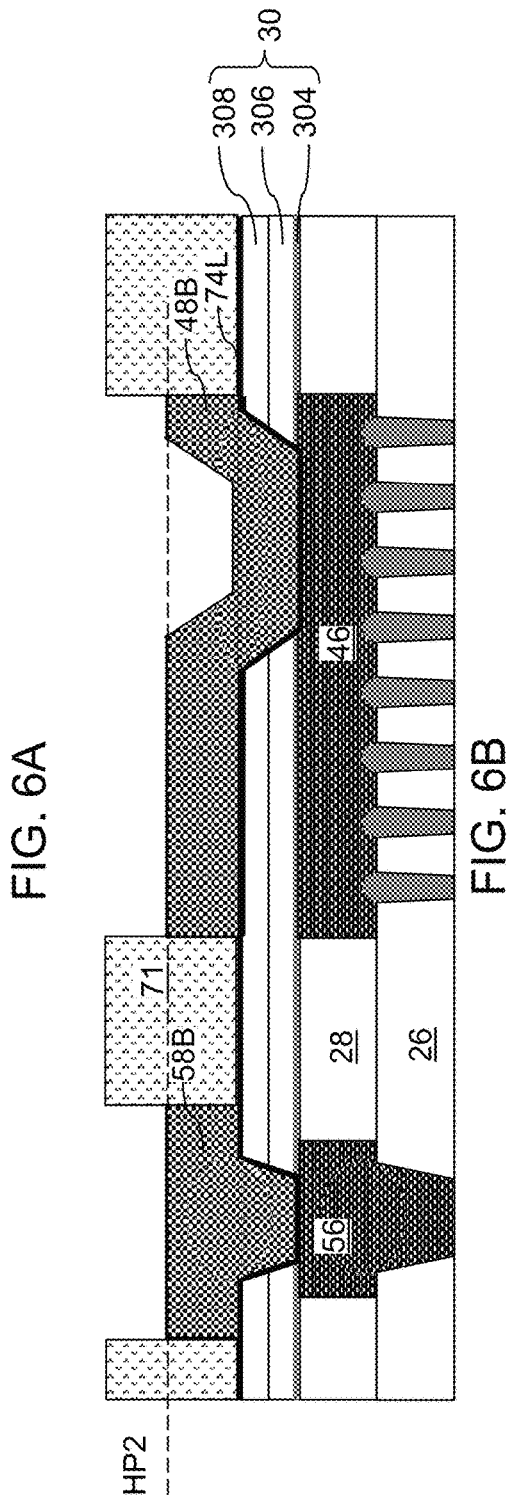

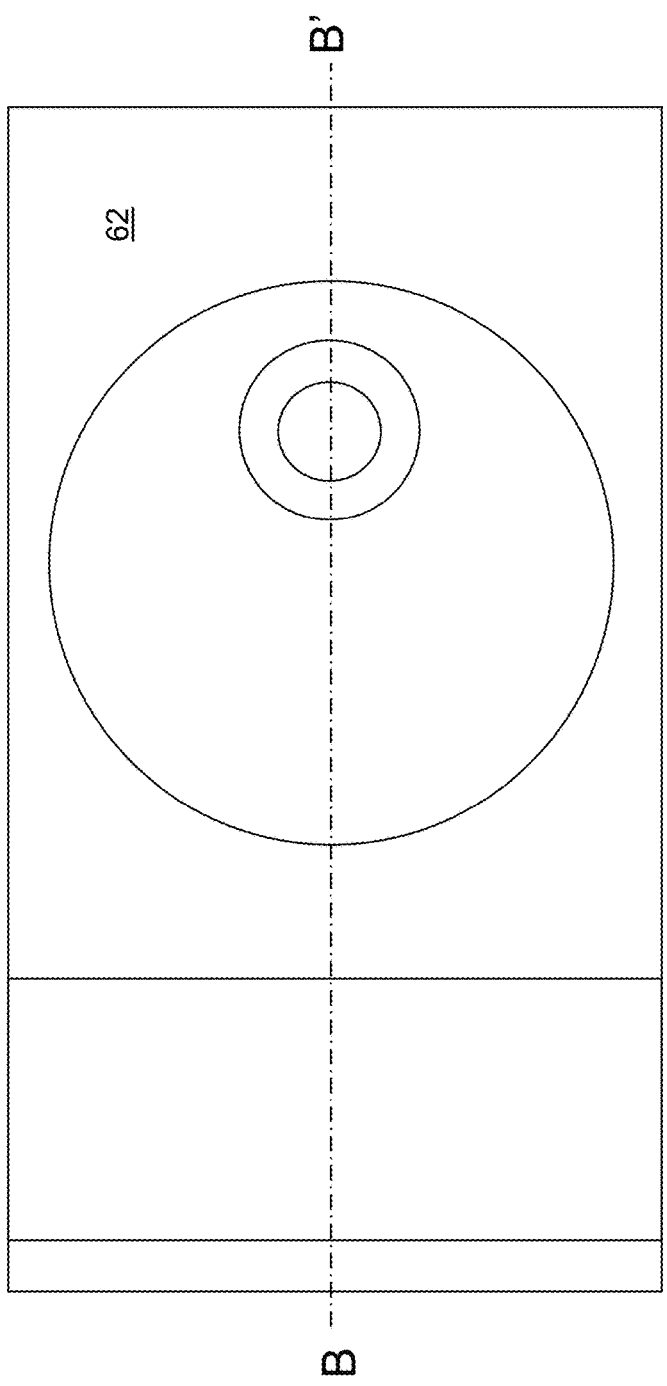
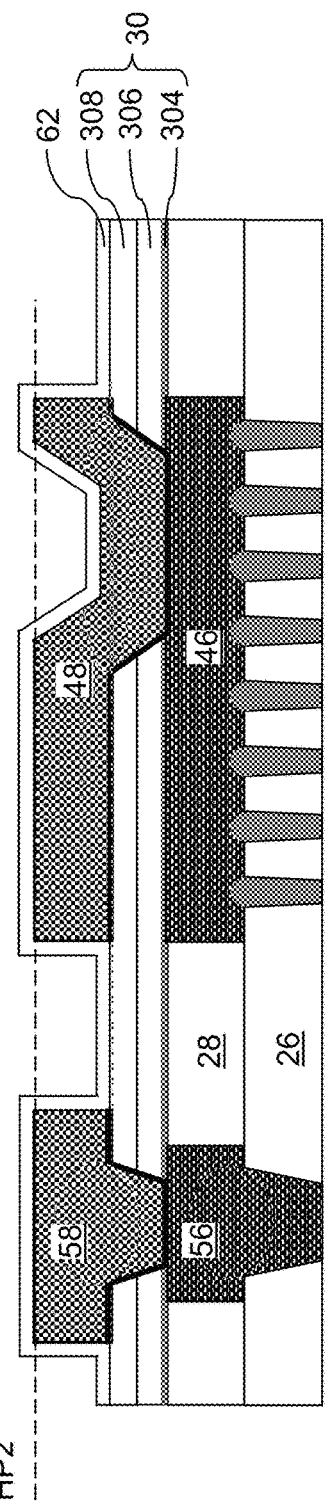
FIG. 9A
FIG. 9B

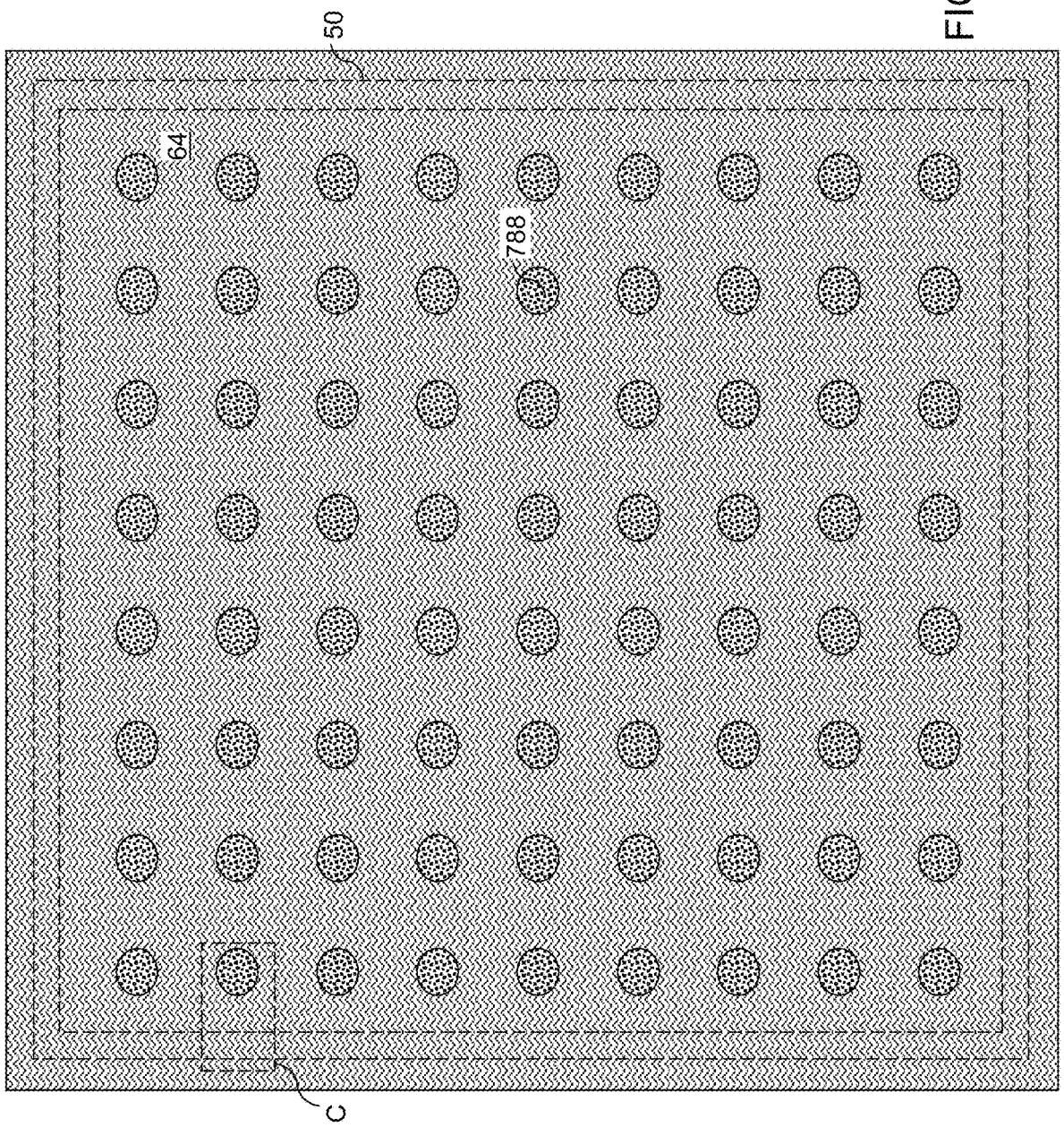

INTERPOSER INCLUDING A COPPER EDGE SEAL RING STRUCTURE AND METHODS OF FORMING THE SAME

BACKGROUND

A fan-out wafer level package (FOWLP) may use an interposer between semiconductor dies and a package substrate. An acceptable interposer possesses sufficient mechanical strength to withstand bonding processes used to attach the semiconductor dies and the package substrate.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 1C is a top-down view of a region C of the exemplary structure of FIG. 1B.

FIG. 1D is a vertical cross-sectional view along the vertical plane D-D' of FIG. 1C.

FIG. 3A is a top-down view of a region of the exemplary structure after formation of pad-level via cavities and a moat trench through the at least one dielectric capping layer according to an embodiment of the present disclosure.

FIG. 3B is a vertical cross-sectional view along the plane B-B' of FIG. 3A.

FIG. 6A is a top-down view of a region of the exemplary structure after electroplating copper according to an embodiment of the present disclosure.

FIG. 6B is a vertical cross-sectional view along the plane B-B' of FIG. 6A.

FIG. 9A is a top-down view of a region of the exemplary structure after formation of a dielectric passivation layer according to an embodiment of the present disclosure.

FIG. 9B is a vertical cross-sectional view along the plane B-B' of FIG. 9A.

FIG. 11B is a top-down view of a unit die area of the exemplary structure of FIG. 11A.

DETAILED DESCRIPTION

Figure 1A:
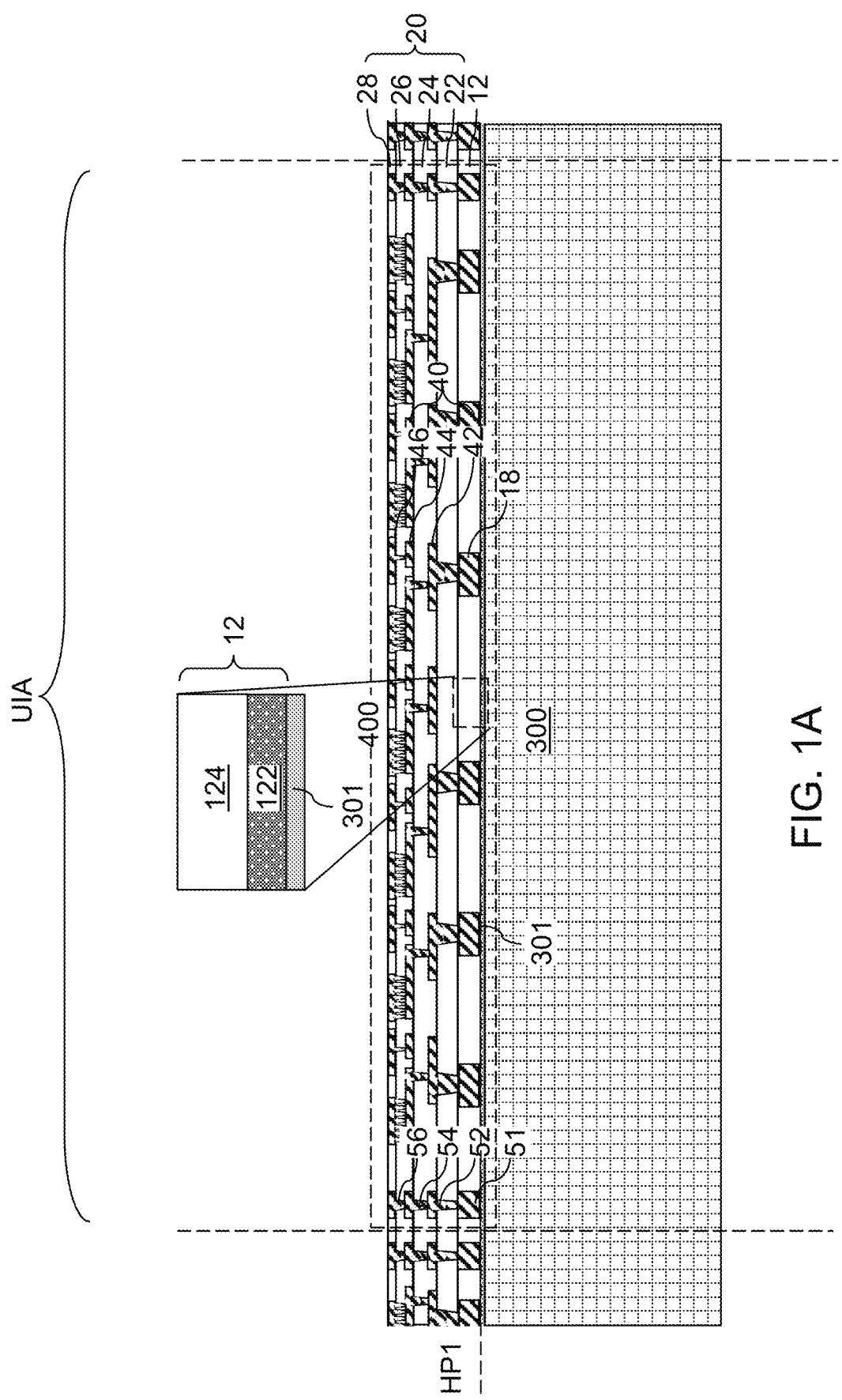
FIG. 1A is a vertical cross-sectional view of an exemplary structure after formation of redistribution interconnect structures embedded in interconnect-level dielectric material layers and interconnect-level metallic ring structures according to an embodiment of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. Unless explicitly stated otherwise, each element having the same reference numeral is presumed to have the same material composition and to have a thickness within a same thickness range.

The present disclosure is directed to semiconductor devices, and particularly to a chip package structure containing an organic interposer including stress-resistant bonding structures and method of forming the same, the various aspects of which are now described in detail.

Generally, the methods and structures of the present disclosure may be used to provide an organic interposer including a copper edge seal ring structure that blocks lateral ingress of moisture, hydrogen, and contaminants. The copper edge seal ring structure may be cooper-based, and may be free of aluminum. The various aspects of the methods and structures of embodiments of the present disclosure are now described with reference to the accompanying drawings.

Figure 1B:
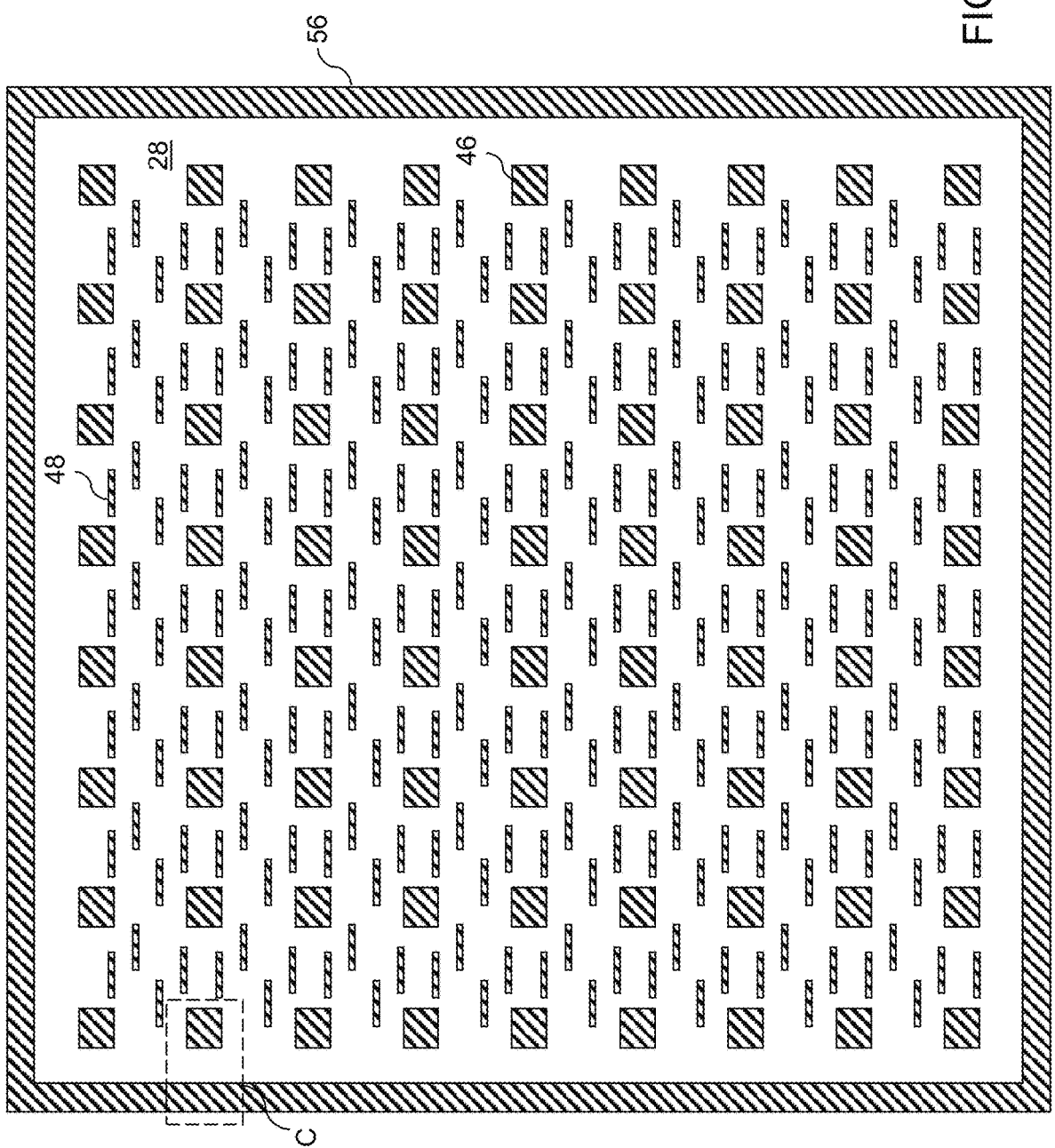
FIG. 1B is a top-down view of a unit die area of the exemplary structure of FIG. 1A.

FIG. 1A is a vertical cross-sectional view of an exemplary structure after formation of redistribution interconnect structures embedded in interconnect-level dielectric material layers and interconnect-level metallic ring structures according to an embodiment of the present disclosure. FIG. 1B is a top-down view of a unit die area of the exemplary structure of FIG. 1A. FIG. 1C is a top-down view of a region C of the exemplary structure of FIG. 1B. FIG. 1D is a vertical cross-sectional view along the vertical plane D-D' of FIG. 1C.

The exemplary structure illustrated in FIGS. 1A-ID includes organic interposers 400 formed over a carrier substrate 300. Each organic interposer 400 may be formed within a respective unit interposer area UIA. A two-dimensional array of organic interposers 400 may be formed on the carrier substrate 300. An organic interposer refers to an interposer including at least one organic insulating material such as an organic polymer matrix material. Each organic interposer 400 may be formed within a respective unit interposer area UIA. The carrier substrate 300 may be a circular wafer or a rectangular wafer. The lateral dimensions (such as the diameter of a circular wafer or a side of a rectangular wafer) of the carrier substrate 300 may be in a range from 100 mm to 500 mm, such as from 200 mm to 400 mm, although lesser and greater lateral dimensions may also be used. The carrier substrate 300 may include a semiconductor substrate, an insulating substrate, or a conductive substrate. The carrier substrate 300 may be transparent or opaque. The thickness of the carrier substrate 300 may be sufficient to provide mechanical support to an array of organic interposers 400 to be subsequently formed thereupon. For example, the thickness of the carrier substrate 300 may be in a range from 60 microns to 1 mm, although lesser and greater thicknesses may also be used.

An adhesive layer 301 may be applied to the top surface of the carrier substrate 300. In one embodiment, the carrier substrate 300 may include an optically transparent material such as glass or sapphire. In this embodiment, the adhesive layer 301 may include a light-to-heat conversion (LTHC) layer. The LTHC layer is a solvent-based coating applied using a spin coating method. The LTHC layer may form a layer that converts ultraviolet light to heat such that the LTHC layer loses adhesion. Alternatively, the adhesive layer 301 may include a thermally decomposing adhesive material. For example, the adhesive layer 301 may include an acrylic pressure-sensitive adhesive that decomposes at an elevated temperature. The debonding temperature of the thermally decomposing adhesive material may be in a range from 150 degrees to 400 degrees. Other suitable thermally decomposing adhesive materials that decompose at other temperatures are within the contemplated scope of disclosure.

Bump structures may be subsequently formed over the adhesive layer 301. The bump structures may be subsequently used to provide bonding to a package substrate, and thus, are herein referred to as package-side bump structures 18. The package-side bump structures 18 may include any metallic material that may be bonded to a solder material. For example, an underbump metallurgy (UBM) layer stack may be deposited over the adhesive layer 301. The order of material layers within the UBM layer stack may be selected such that solder material portions may be subsequently bonded to portions of the bottom surface of the UBM layer stack. Layer stacks that may be used for the UBM layer stack include, but are not limited to, stacks of Cr/Cr-Cu/Cu/Au, Cr/Cr-Cu/Cu, TiW/Cr/Cu, Ti/Ni/Au, and Cr/Cu/Au. Other suitable materials are within the contemplated scope of disclosure. The thickness of the UBM layer stack may be in a range from 5 microns to 60 microns, such as from 10 microns to 30 microns, although lesser and greater thicknesses may also be used.

A photoresist layer may be applied over the UBM layer stack, and may be lithographically patterned to form an array of discrete patterned photoresist material portions and a continuous ring-shaped photoresist material portion that laterally surrounds the array of discrete patterned photoresist material portions. An etch process may be performed to remove unmasked portions of the UBM layer stack. The etch process may be an isotropic etch process or an anisotropic etch process. Remaining portions of the UBM layer stack that underlie the array of discrete patterned photoresist material portions comprise the package-side bump structures 18. A ring-shaped patterned portion of the UBM layer stack that underlies the continuous ring-shaped photoresist material portion comprises a package-side metallic ring structure 51. In one embodiment, the package-side bump structures 18 may be arranged as a two-dimensional array. The two-dimensional periodic array may be a rectangular periodic array. In one embodiment, the package-side bump structures 18 may be formed as controlled collapse chip connection (C4) bump structures. In one embodiment, the package-side metallic ring structure 51 may include copper at an atomic percentage greater than 80%, such as greater than 90% and/or greater than 95%. The photoresist layer may be subsequently removed, for example, by ashing.

A package-side dielectric material layer 12 may be deposited over the package-side bump structures 18. The package-side dielectric material layer 12 includes at least one dielectric material. In one embodiment, the package-side dielectric material layer 12 may include a layer stack of a package-side silicon nitride layer 122 and a package-side silicon oxide layer 124. The package-side silicon nitride layer 122 may have a thickness in a range from 50 nm to 300 nm. The package-side silicon nitride layer 122 may be used as a package-side passivation dielectric layer that blocks diffusion of moisture, hydrogen, and contaminants from a first side (i.e., the package side) of an organic interposer to be formed. The thickness of the package-side dielectric material layer 12 may be greater than the thickness of the package-side bump structures 18. For example, the thickness of the package-side dielectric material layer 12 may be in a range from 5 microns to 60 microns, such as from 10 microns to 30 microns, although lesser and greater thicknesses may also be used. Optionally, a chemical mechanical planarization process may be performed to remove portions of the package-side dielectric material layer 12 from above the horizontal plane including the top surfaces of the package-side bump structures 18. Generally, package-side bump structures 18 embedded in the package-side dielectric material layer 12 may be formed over the carrier substrate 300. Bottom surfaces (which are also referred to distal planar surfaces) of the package-side bump structures 18 and the bottom surfaces (which are also referred to as distal planar surfaces) of the package-side dielectric material layer 12 may be formed within a first horizontal plane HP1, which is the horizontal plane including the top surface of the adhesive layer 301.

Redistribution interconnect structures 40 and interconnect-level metallic ring structures (52, 54, 56) embedded in additional dielectric material layers may be subsequently formed over the package-side bump structures 18 and the package-side dielectric material layer 12. The redistribution interconnect structures 40 and interconnect-level metallic ring structures (52, 54, 56) may be copper-based, and may include copper at an atomic percentage greater than 95%. The additional dielectric material layers are herein referred to collectively as interconnect-level dielectric material layers 20. The interconnect-level dielectric material layers 20 may include a plurality of dielectric material layers 20 such as a first dielectric material layer 22, a second dielectric material layer 24, a third dielectric material layer 26, and a fourth dielectric material layer 28. While the present disclosure is described using an embodiment in which four dielectric material layers 20 embed redistribution interconnect structures 40, embodiments are expressly contemplated herein in which the interconnect-level dielectric material layers 20 include two, three, or five or more dielectric material layers.

Generally, at least one of the interconnect-level dielectric material layers 20 may include an organic polymer matrix layer, i.e., a continuous material layer that includes, and/or consists essentially of, an organic polymer. In one embodiment, each of the interconnect-level dielectric material layers 20 may include an organic polymer matrix layer. Thus, an organic interposer to be subsequently formed includes at least one organic polymer matrix layer. Generally, the interconnect-level dielectric material layers 20 may be formed over the package-side dielectric material layer 12, and a subset of the redistribution interconnect structures 40 is formed on the package-side bump structures 18.

The redistribution interconnect structures 40 include multiple levels of redistribution interconnect structures 40 that may be formed through a respective one of the dielectric material layers 20. The redistribution interconnect structures 40 may include metal via structures, metal line structures, and/or integrated line and via structures. Each integrated line and via structure includes a unitary structure containing a metal line structure and at least one metal via structure. A unitary structure refers to a single continuous structure in which each point within the structure may be connected by a continuous line (which may or may not be straight) that extends only within the structure.

In an illustrative example, the redistribution interconnect structures 40 may include first redistribution interconnect structures 42 that are formed through, and/or on a top surface of, the first dielectric material layer 22; second redistribution interconnect structures 44 that are formed through, and/or on a top surface of, the second dielectric material layer 24; and third redistribution interconnect structures 46 that are formed through, and/or on a top surface of, the third dielectric material layer 26.

The interconnect-level metallic ring structures (52, 54, 56) may be formed at the same level as the redistribution interconnect structures 40. For example, the interconnect-level metallic ring structures (52, 54, 56) may include a first interconnect-level metallic ring structure 52, a second interconnect-level metallic ring structure 54, and a third interconnect-level metallic ring structure 56. The first interconnect-level metallic ring structure 52 may be formed at the same level as, and has a same thickness and a same material composition as, the first redistribution interconnect structures 42. The second interconnect-level metallic ring structure 54 may be formed at the same level as, and has a same thickness and a same material composition as, the second redistribution interconnect structures 44. The third interconnect-level metallic ring structure 56 is formed at the same level as, and has a same thickness and a same material composition as, the third redistribution interconnect structures 46. The total number of the interconnect-level metallic ring structures (52, 54, 56) may be changed depending on the total number of levels of the redistribution interconnect structures 40. A vertical stack of metallic ring structures (51, 52, 54, 56) may be provided. Generally, the metallic ring structures (51, 52, 54, 56) may be copper-based, and may include copper at an atomic percentage greater than 95%. In one embodiment, the vertical stack of interconnect-level metallic ring structures (52, 54, 56) may be free of aluminum, and may laterally enclose the package-side bump structures 18 and each of the redistribution interconnect structures 40.

Each of the interconnect-level dielectric material layers 20 may include a dielectric polymer material such as polyimide (PI), benzocyclobutene (BCB), or polybenzobisoxazole (PBO). Other suitable materials are within the contemplated scope of disclosure. The thickness of each interconnect-level dielectric material layer 20 may be in a range from 4 microns to 20 microns, although lesser and greater thicknesses may also be used. Each of the redistribution interconnect structures 40 includes at least one metallic material such as Cu, Mo, Co, Ru, W, TiN, TaN, WN, or a combination or a stack thereof. Other suitable materials are within the contemplated scope of disclosure. For example, each of the redistribution interconnect structures 40 may include a layer stack of a TiN layer and a Cu layer. In embodiments in which a redistribution interconnect structure 40 include a metal line structure, the thickness of the metal line structure may be in a range from 2 microns to 20 microns, although lesser and greater thicknesses may also be used.

For example, the third dielectric material layer 26 may be deposited over the second dielectric material layer 24 and the second redistribution interconnect structures 44 such that the top surface of the third dielectric material layer 26 is vertically spaced from, and overlies, top surfaces of the second redistribution interconnect structures 44. Via cavities may be formed through the third dielectric material layer 26 such that a top surface of a second redistribution interconnect structure 44 is physically exposed at the bottom of each via cavity. At least one metallic material may be deposited in the via cavities and over the third dielectric material layer 26 to form the third redistribution interconnect structures 46. A dielectric material may be deposited and planarized to form the fourth dielectric material layer 28. In one embodiment, the fourth dielectric material layer 28 may include an organic polymer matrix layer. In another embodiment, the fourth dielectric material layer 28 may include a silicon oxide layer. The dielectric material of the fourth dielectric material layer may be deposited and planarized after formation of the third redistribution interconnect structures 46. Alternatively, the dielectric material of the fourth dielectric material layer 28 may be deposited after deposition of the dielectric material of the third dielectric material layer 26, and line trenches may be formed in the fourth dielectric material layer 28 and via cavities having an areal overlap with a line trench may be formed through the third dielectric material layer 26 so that a top surface of a second redistribution interconnect structure 44 is physically exposed at the bottom of each via cavity. The via cavities and the line cavities and be concurrently filled with at least one metallic material, and excess portions of the at least one metallic material may be removed from above the horizontal plane including the top surface of the fourth dielectric material layer 28 to form the third redistribution interconnect structures 46.

In one embodiment, second redistribution interconnect structures 44 may be formed, which include line portions that overlie a second dielectric material layer 24. A third dielectric material layer 26 may be subsequently deposited and may be patterned to form via cavities therethrough. At least one metallic material may be deposited in the via cavities and over the third dielectric material layer 26, for example, by physical vapor deposition (PVD) and/or electroplating. In one embodiment, the at least one metallic material may consist essentially of copper. In one embodiment, the at least one metallic material may have a thickness in a range from 3 microns to 10 microns.

In an alternative embodiment, second redistribution interconnect structures 44 may be formed, which include line portions that overlie a second dielectric material layer 24. A third dielectric material layer 26 may be deposited over the second dielectric material layer 24, and a fourth dielectric material layer 28 may be deposited over the third dielectric material layer 26. The fourth dielectric material layer 28 may include a same dielectric material as, or may include a different dielectric material from, the dielectric material of the third dielectric material layer 26. In embodiments in which the fourth dielectric material layer 28 includes the same material as the third dielectric material layer 26, a single dielectric material layer may be used in lieu of a stack of the third dielectric material layer 26 and the fourth dielectric material layer 28.

Line cavities may be formed through the fourth dielectric material layer 28, for example, by application and patterning of a first photoresist layer over the fourth dielectric material layer 28 to form line patterns, and by transfer of the line pattern in the first photoresist layer through the fourth dielectric material layer 28. The first photoresist layer may be removed, for example, by ashing. Via cavities may be formed thorough the third dielectric material layer 26, for example, by application and patterning of a second photoresist layer over the fourth dielectric material layer 28 and in the line trenches to form a via pattern, and by transfer of the via pattern through the third dielectric material layer 26. The second photoresist layer may be subsequently removed, for example, by ashing.

Figure 2A:
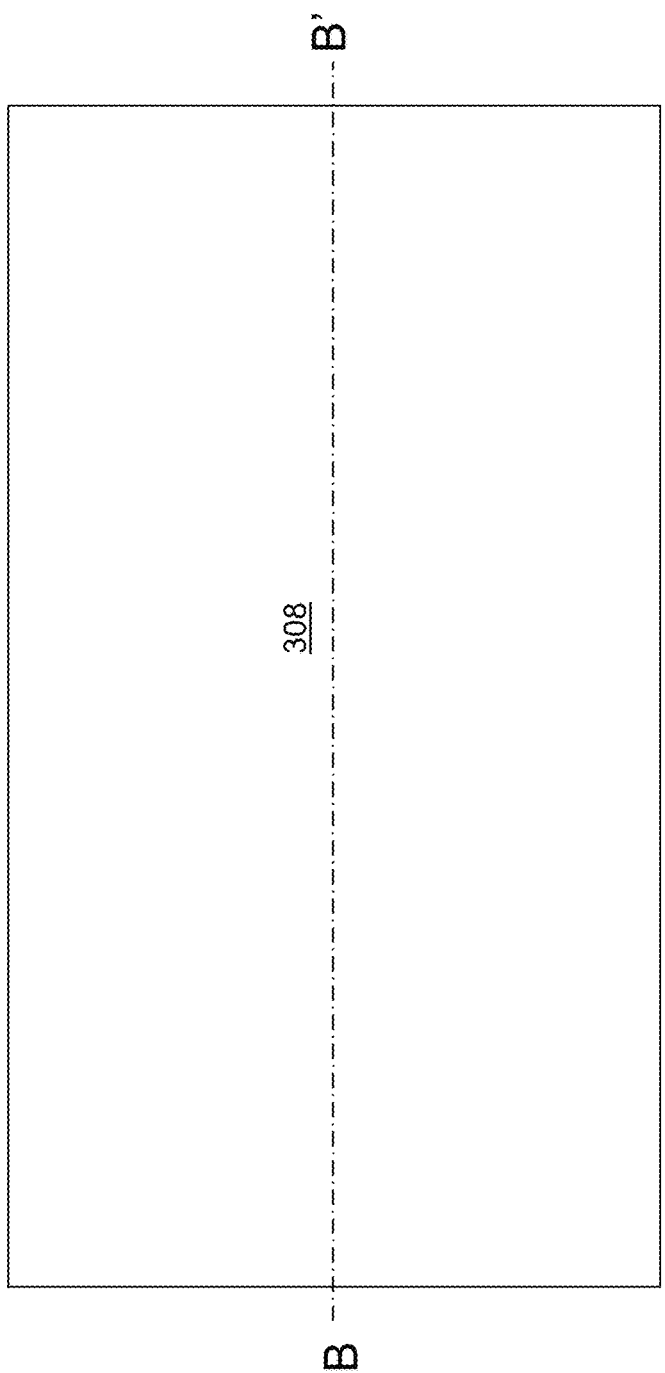
FIG. 2A is a top-down view of a region of the exemplary structure after formation of at least one dielectric capping layer according to an embodiment of the present disclosure.
Figure 2B:
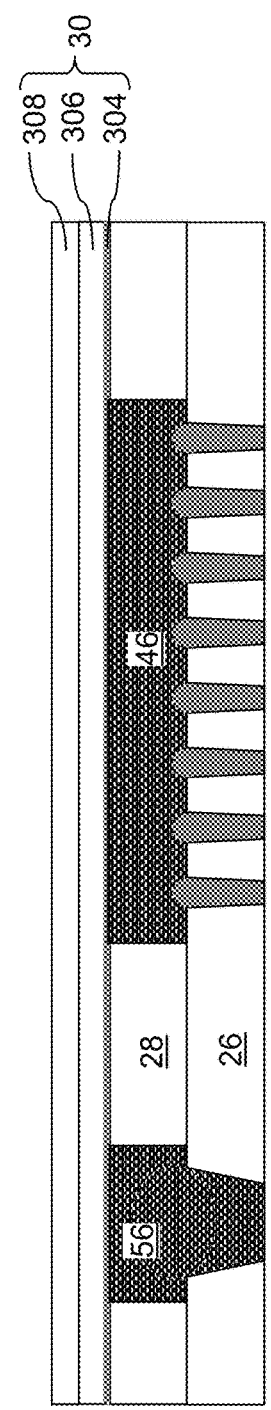
FIG. 2B is a vertical cross-sectional view along the plane B-B' of FIG. 2A.

Referring to FIGS. 2A and 2B, at least one dielectric capping layer 30 may be formed over the topmost interconnect-level dielectric material layer (such as the fourth dielectric material layer 28) of the interconnect-level dielectric material layers 20. The at least one dielectric capping layer 30 may include an inorganic dielectric material such as silicon nitride, silicon oxide, silicon oxynitride, silicon oxide carbide, a dielectric metal oxide, or a combination thereof. In a non-limiting illustrative example, the at least one dielectric capping layer 30 may include a layer stack including, from bottom to top, a silicon nitride layer 304, a first silicon oxide layer 306 including a first silicate glass material such undoped silicate glass, and a second silicon oxide layer 308 including a second silicate glass material such as a doped silicate glass. The total thickness of the at least one dielectric capping layer 30 may be in a range from 200 nm to 4 microns, such as from 400 nm to 2 microns, although lesser and greater thicknesses may also be used. In a non-limiting illustrative example, the silicon nitride layer 304 may have a thickness in a range from 10 nm to 200 nm, the first silicon oxide layer 306 may have a thickness in a range from 80 nm to 2 microns, and the second silicon oxide layer 308 may have a thickness in a range from 80 nm to 2 microns, although lesser and greater thicknesses may be used for each layer.

Referring to FIGS. 3A and 3B, a photoresist layer (not shown) may be applied over the at least one dielectric capping layer 30, and may be lithographically patterned to form discrete openings and a ring-shaped opening that laterally surrounds the discrete opening. An anisotropic etch process is performed to transfer the pattern of the openings in the photoresist layer through the at least one dielectric capping layer 30. A moat trench 59 may be formed through the at least one dielectric capping layer 30 underneath the ring-shaped opening in the photoresist layer. Pad-level via cavities 49 may be formed through the at least one dielectric capping layer 30 underneath the discrete openings in the photoresist layer. A top surface of the interconnect-level metallic ring structures (52, 54, 56) is exposed at a bottom of the moat trench 59. Top surfaces of the redistribution interconnect structures, such as the third redistribution interconnect structures 46, are exposed underneath the pad-level via cavities 49.

Figure 4A:
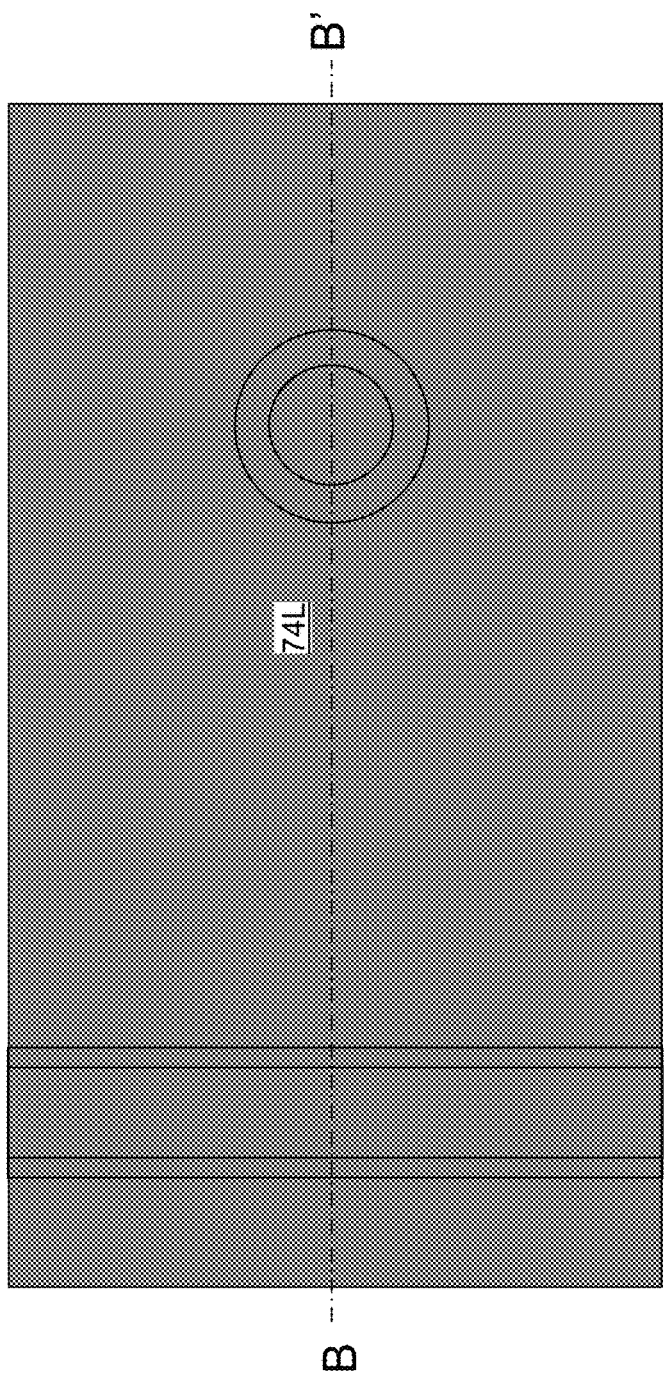
FIG. 4A is a top-down view of a region of the exemplary structure after formation of a metallic seed layer according to an embodiment of the present disclosure.
Figure 4B:
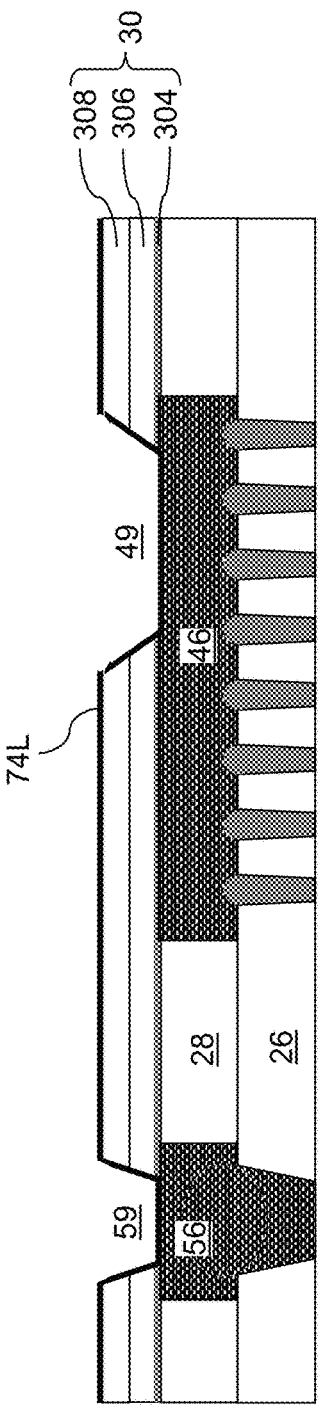
FIG. 4B is a vertical cross-sectional view along the plane B-B' of FIG. 4A.

Referring to FIGS. 4A and 4B, a continuous metallic seed layer 74L may be deposited in the moat trench 59 and the pad-level via cavities 49 over the at least one dielectric capping layer 30. The continuous metallic seed layer 74L includes a metallic material such as a conductive metallic nitride material (such as TiN, TaN, and/or WN) and/or copper, and may be deposited by physical vapor deposition. The continuous metallic seed layer 74L may have a thickness in a range from 5 nm to 100 nm, although lesser and greater thicknesses may also be used.

Figure 5A:
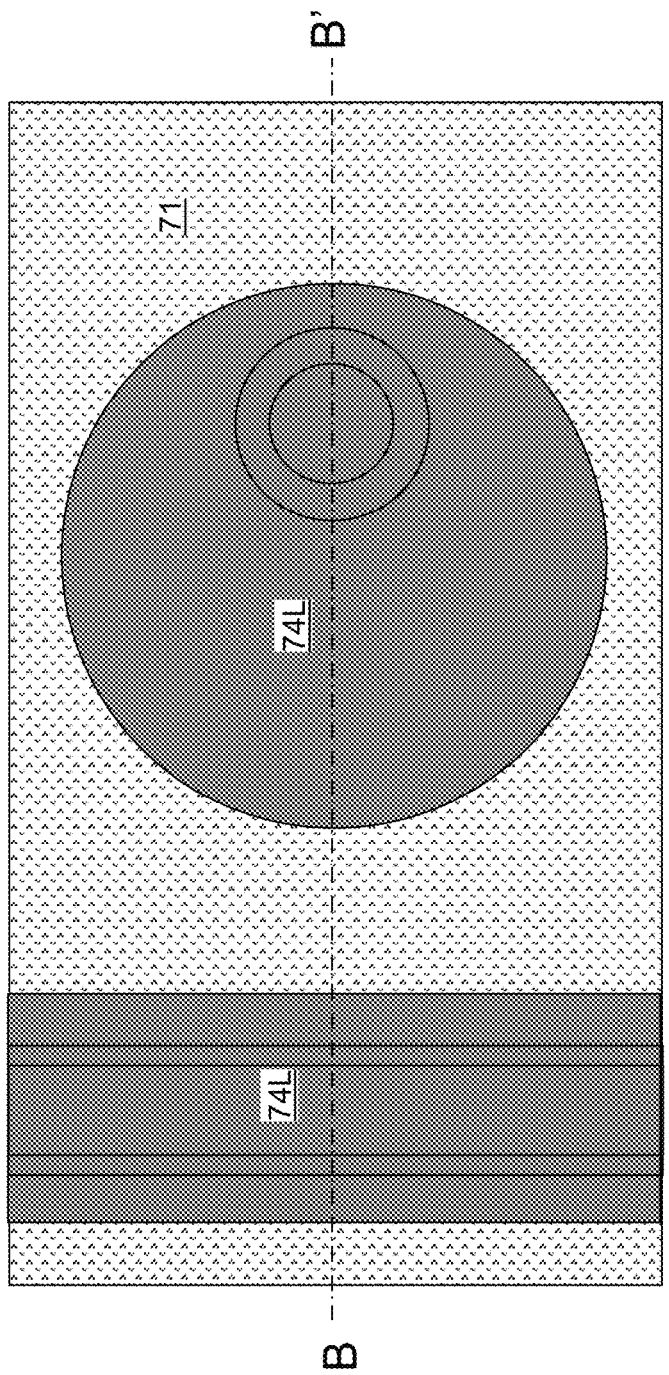
FIG. 5A is a top-down view of a region of the exemplary structure after formation of a patterned photoresist layer according to an embodiment of the present disclosure.
Figure 5B:
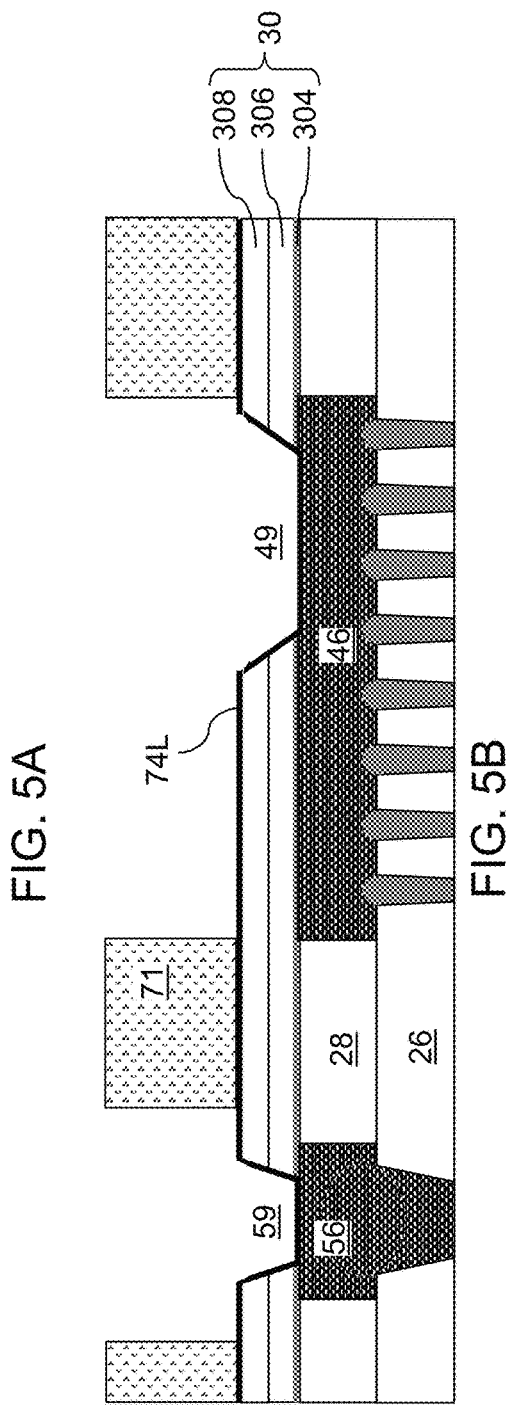
FIG. 5B is a vertical cross-sectional view along the plane B-B' of FIG. 5A.

Referring to FIGS. 5A and 5B, a photoresist layer 71 may be applied over the continuous metallic seed layer 74L, and may be lithographically patterned to form various openings over areas of the moat trench 59 and the pad-level via cavities 49 through the at least one dielectric capping layer 30. The thickness of the photoresist layer 71 may be in a range from 2 microns to 10 microns, although lesser and greater thicknesses may also be used. The openings in the photoresist layer 71 include discrete openings that may be formed in areas that include the areas of the pad-level via cavities 49 and a ring-shaped opening that may be formed in an area that includes the entire area of the moat trench 59. In one embodiment, each discrete opening in the photoresist layer 71 may have a horizontal cross-sectional shape of a circle, a rectangle, or a rounded rectangle, and may have a greater area than the area of a respective underlying pad-level via cavity 49. In one embodiment, the maximum lateral dimension of each discrete opening in the photoresist layer may be in a range from 5 microns to 100 microns, although lesser and greater dimensions may also be used.

Referring to FIGS. 6A and 6B, an electroplating process may be performed to electroplate copper on the physically exposed surfaces of the continuous metallic seed layer 74L. The thickness of the deposited copper may be less than the thickness of the photoresist layer 71 may be in a range from 1 nm to 10 nm, although lesser and greater thicknesses may also be used. A copper pad portion 48B may be formed within each opening in the photoresist layer 71 that overlies a pad-level via cavity 49. A copper ring structure 58B may be formed within an opening in the photoresist layer 71 that overlies the moat trench 59. The top surfaces of the copper pad portions 48B and the top surface of the copper ring structure 58B may be formed within a same horizontal plane, which is herein referred to as a second horizontal plane HP2.

Figure 7A:
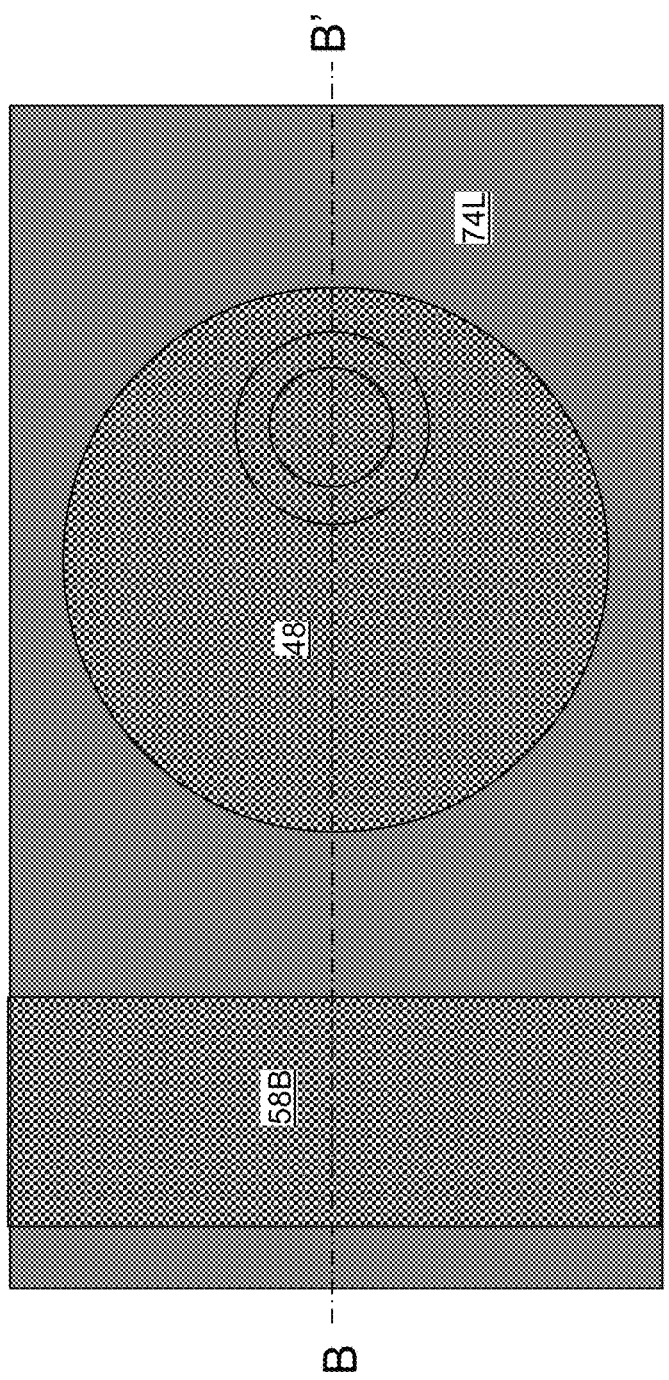
FIG. 7A is a top-down view of a region of the exemplary structure after removal of the patterned photoresist layer according to an embodiment of the present disclosure.
Figure 7B:
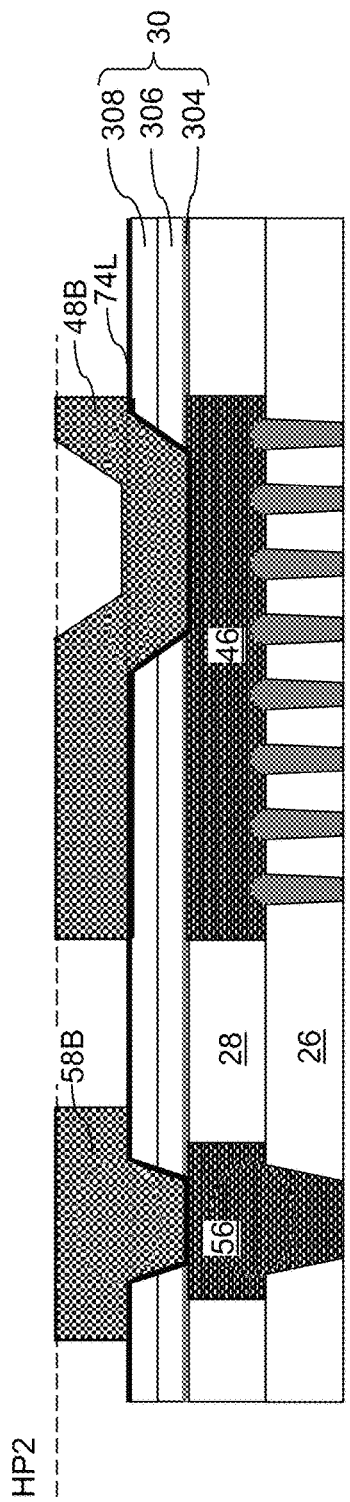
FIG. 7B is a vertical cross-sectional view along the plane B-B' of FIG. 7A.

Referring to FIGS. 7A and 7B, the photoresist layer 71 may be removed, for example, by ashing or by dissolution in a solvent.

Figure 8A:
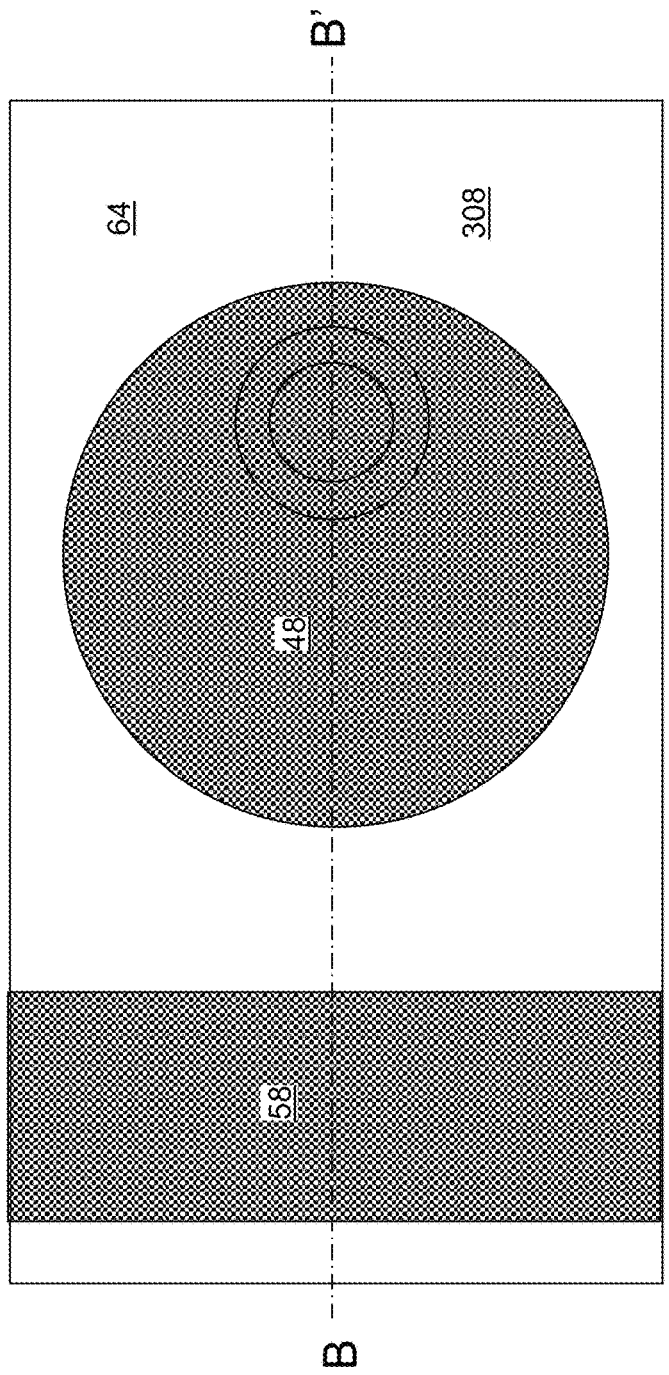
FIG. 8A is a top-down view of a region of the exemplary structure after removal of unmasked portions of the metallic seed layer according to an embodiment of the present disclosure.
Figure 8B:
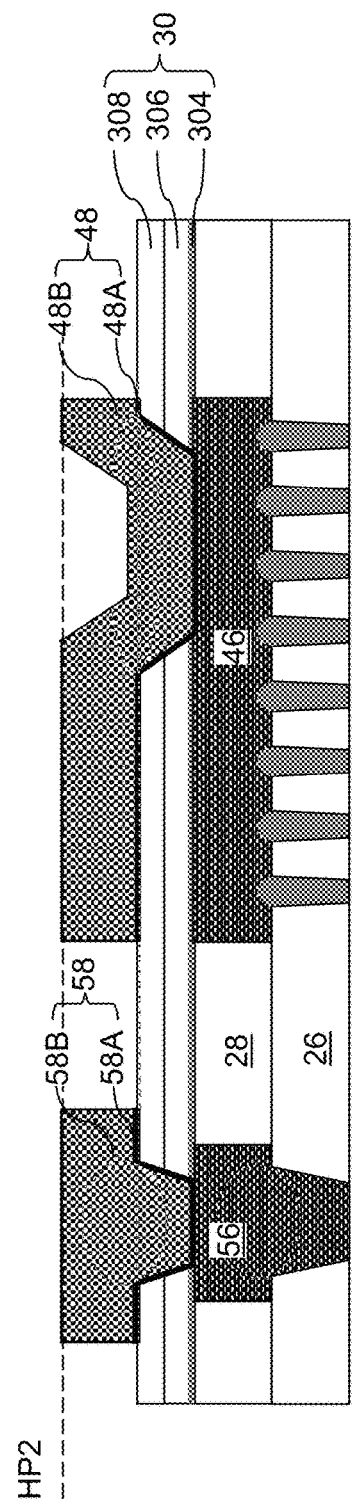
FIG. 8B is a vertical cross-sectional view along the plane B-B' of FIG. 8A.

Referring to FIGS. 8A and 8B, an etch process may be performed to remove portions of the continuous metallic seed layer 74L that are not masked by a portion of the electroplated copper that overlies a respective via cavity through the at least one dielectric capping layer 30. Each patterned portion of the continuous metallic seed layer 74L comprises a respective metallic seed layer (48A, 58A), which include first metallic seed layers 48A formed in the pad-level via cavities 49 and a second metallic seed layer 58A formed in the moat trench 59. Each contiguous combination of a first metallic seed layer 48A and a copper pad portion 48B constitutes a metallic pad structure 48. The combination of the second metallic seed layer 58A and the copper ring structure 58B constitutes a pad-level metallic ring structure 58. In one embodiment, the metallic pad structures 48 and the pad-level metallic ring structure 58 may consist essentially of copper.

Each metallic pad structure 48 includes a pad via portion located under the horizontal plane including the top surface of the at least one dielectric capping layer 30 and a pad plate portion located above the horizontal plane including the top surface of the at least one dielectric capping layer 30. The pad-level metallic ring structure 58 includes a ring-shaped metal via portion located under the horizontal plane including the top surface of the at least one dielectric capping layer 30 and a ring-shaped metal line portion located above the horizontal plane including the top surface of the at least one dielectric capping layer 30.

Referring to FIGS. 9A and 9B, a dielectric passivation layer 62 may be deposited over the metallic structures (not illustrated) that are formed through, and over, the at least one dielectric capping layer 30 such as metallic pad structures (not illustrated) that contact a top surface of a respective third redistribution interconnect structures 46. In one embodiment, the dielectric passivation layer 62 may include an inorganic dielectric material such as silicon nitride. In one embodiment, the dielectric passivation layer 62 may include a silicon nitride layer having a thickness in a range from 300 nm to 1.5 microns, although lesser and greater thicknesses may also be used.

Figure 10A:
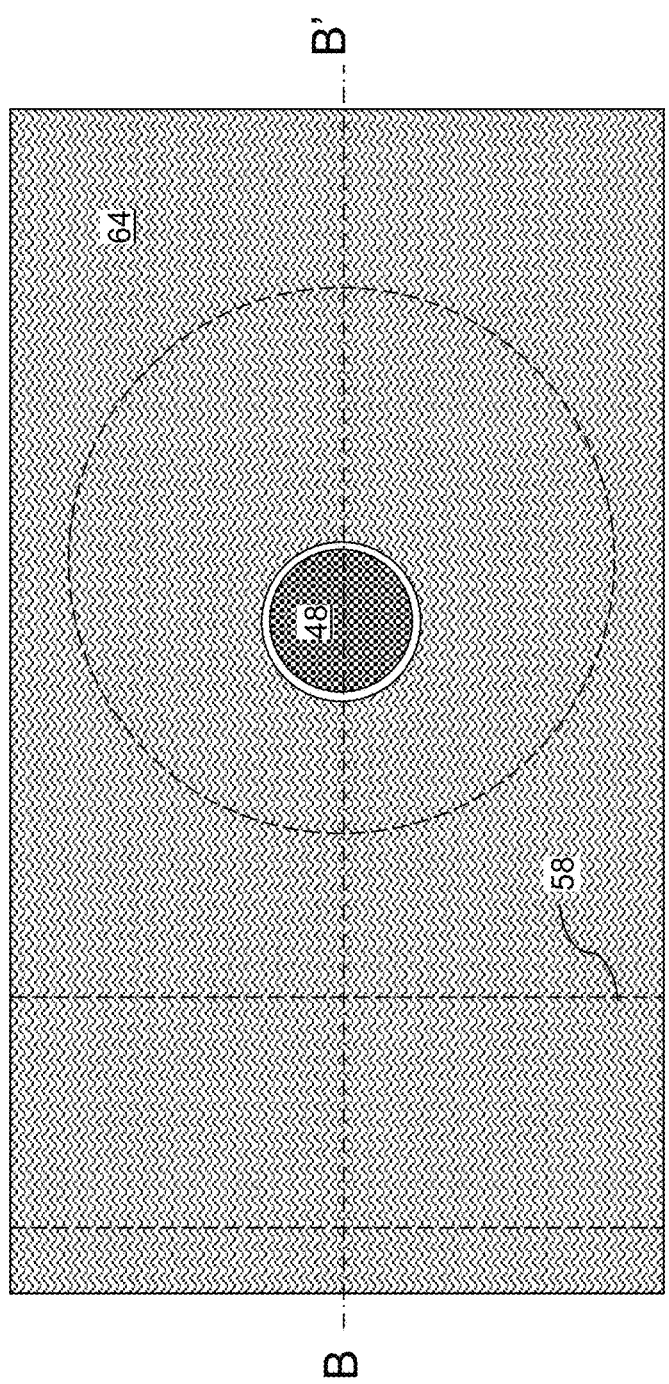
FIG. 10A is a top-down view of a region of the exemplary structure after formation of a bonding-level polymer layer and formation of bonding-level via cavities according to an embodiment of the present disclosure.
Figure 10B:
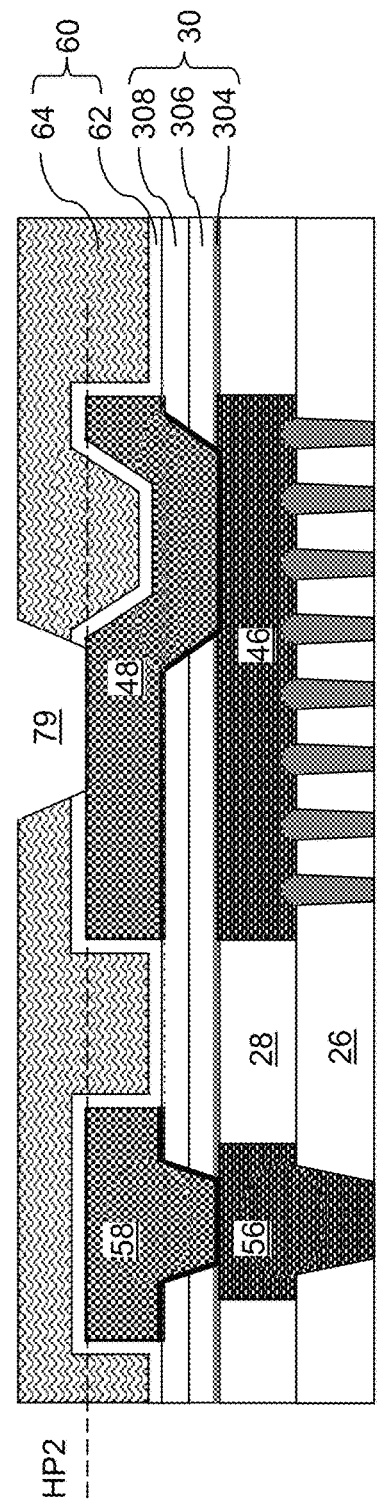
FIG. 10B is a vertical cross-sectional view along the plane B-B' of FIG. 10A.

Referring to FIGS. 10A and 10B, a bonding-level polymer layer 64 may be applied over the dielectric passivation layer 62. The bonding-level polymer layer 64 may include a photosensitive polymer material such as polyimide. The combination of the dielectric passivation layer 62 and the bonding-level polymer layer 64 is herein referred to as a bonding-level dielectric layer 60. The bonding-level dielectric layer 60 may cover an entire area of the pad-level metallic ring structure 58 and contacts a top surface, an inner sidewall, and an outer sidewall of the pad-level metallic ring structure 58. The bonding-level polymer layer 64 may be patterned to form via openings 79 in areas that overlie the metallic pad structures 48. An etch process may be performed to transfer the pattern of the openings in the bonding-level polymer layer 64 through underlying portions of the dielectric passivation layer 62. Top surfaces of the metallic pad structures 48 may be physically exposed underneath the via openings 79 in the bonding-level dielectric layer 60. Generally, the via openings 79 are formed through the bonding-level dielectric layer 60 over the metallic pad structures 48.

Figure 11A:
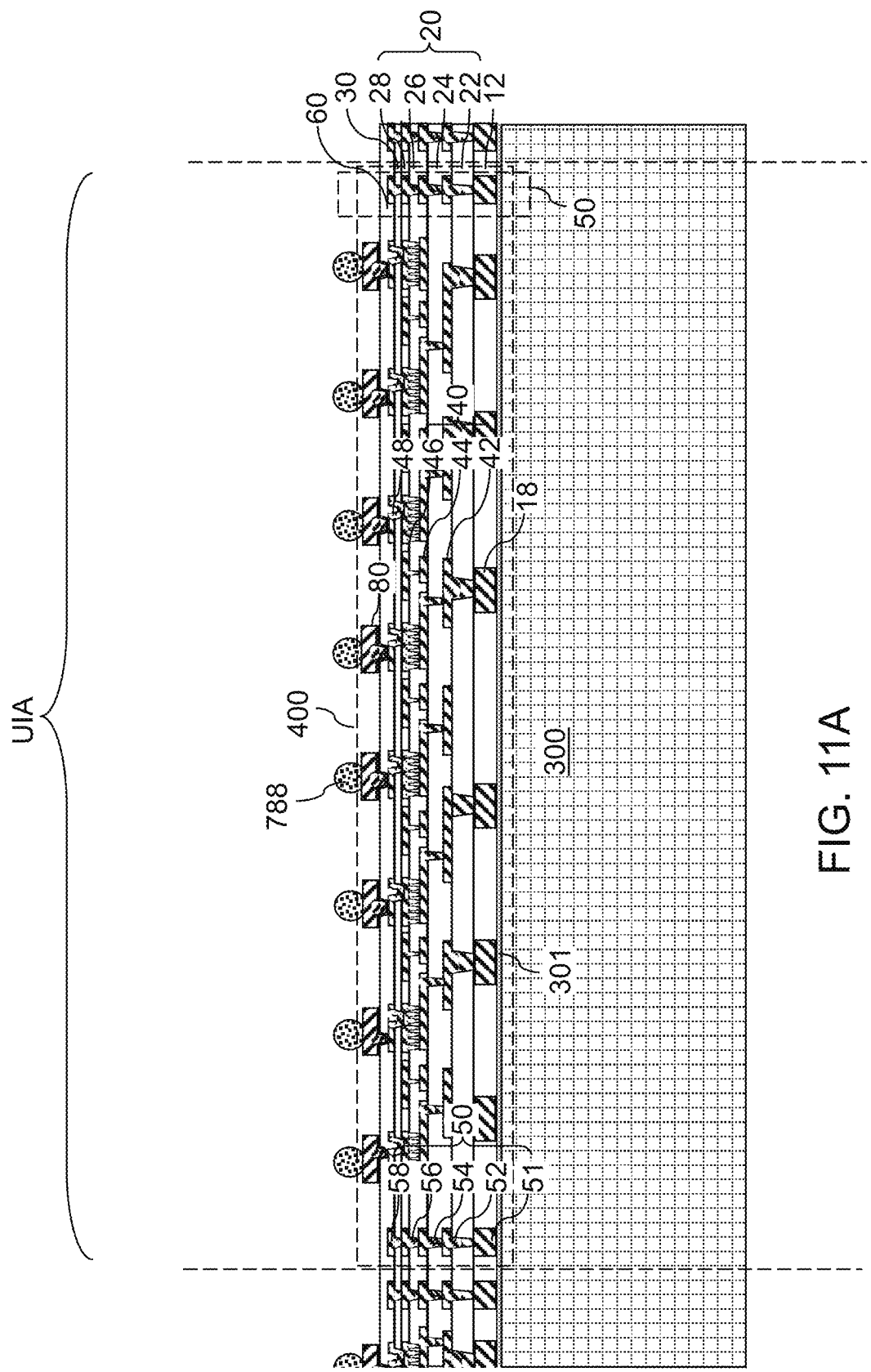
FIG. 11A is a vertical cross-sectional view of the exemplary structure after formation of die-side bump structures and attaching solder balls to the die-side bump structures according to an embodiment of the present disclosure.
Figure 11C:
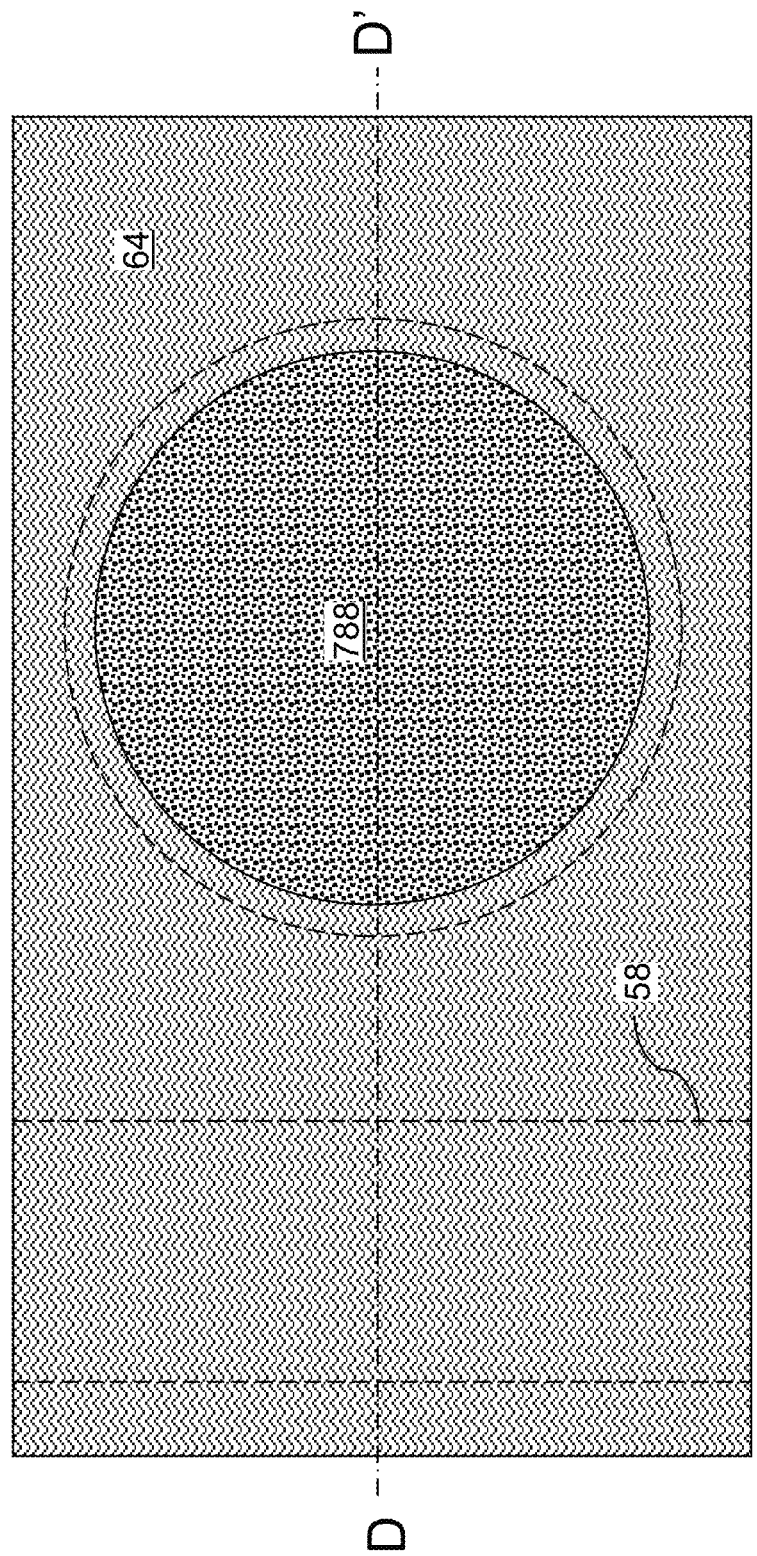
FIG. 11C is a top-down view of a region C of the exemplary structure of FIG. 11B.
Figure 11D:
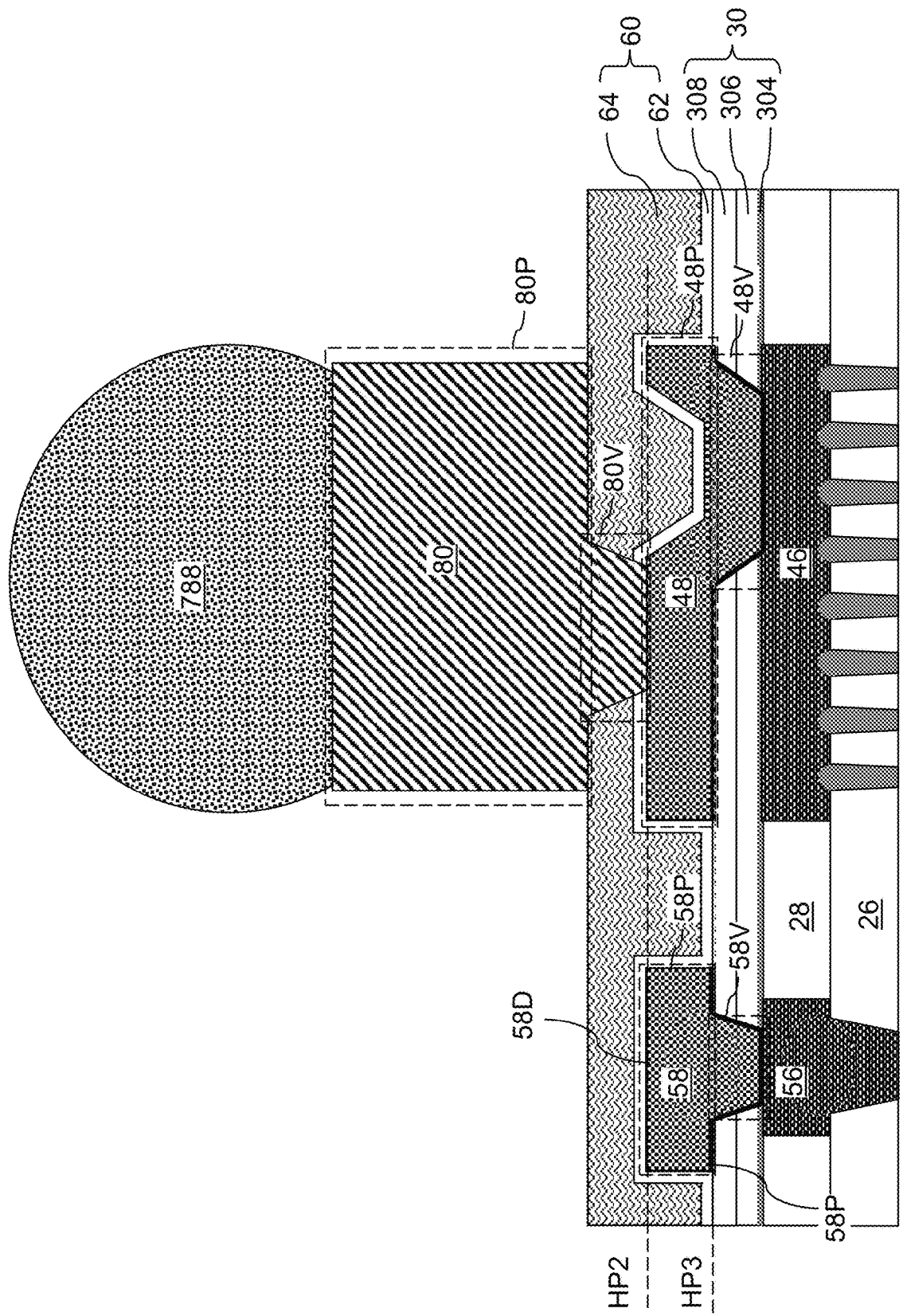
FIG. 11D is a vertical cross-sectional view along the vertical plane D-D' of FIG. 11C.

FIG. 11A is a vertical cross-sectional view of the exemplary structure after formation of die-side bump structures and attaching solder balls to the die-side bump structures according to an embodiment of the present disclosure. FIG. 11B is a top-down view of a unit die area of the exemplary structure of FIG. 11A. FIG. 11C is a top-down view of a region C of the exemplary structure of FIG. 11B. FIG. 11D is a vertical cross-sectional view along the vertical plane D-D' of FIG. 11C.

Copper may be deposited on the physically exposed surfaces of the metallic pad structures (not illustrated). For example, a copper seed layer or a metallic nitride seed layer (including a metallic nitride material such as TiN, TaN, or WN) may be deposited by physical vapor deposition, and a photoresist layer (not shown) may be deposited over the copper seed layer. An electroplating process may be performed to electroplate copper on unmasked portions of the copper seed layer or the metallic nitride seed layer to form copper bump structures, which are herein referred to as die-side bump structures 80. The die-side bump structures 80 may be formed on the metallic pad structures 48. The die-side bump structures 80 may have a height (as measured between a bottom surface contacting a top surface of the bonding-level dielectric layer 60 to the top surface of the die-side bump structure 80) in a range from 40 microns to 150 microns, such as from 60 microns to 100 microns, although lesser and greater thicknesses may also be used. The photoresist layer may be subsequently removed, for example, by ashing or by dissolution in a solvent.

Figure 12:
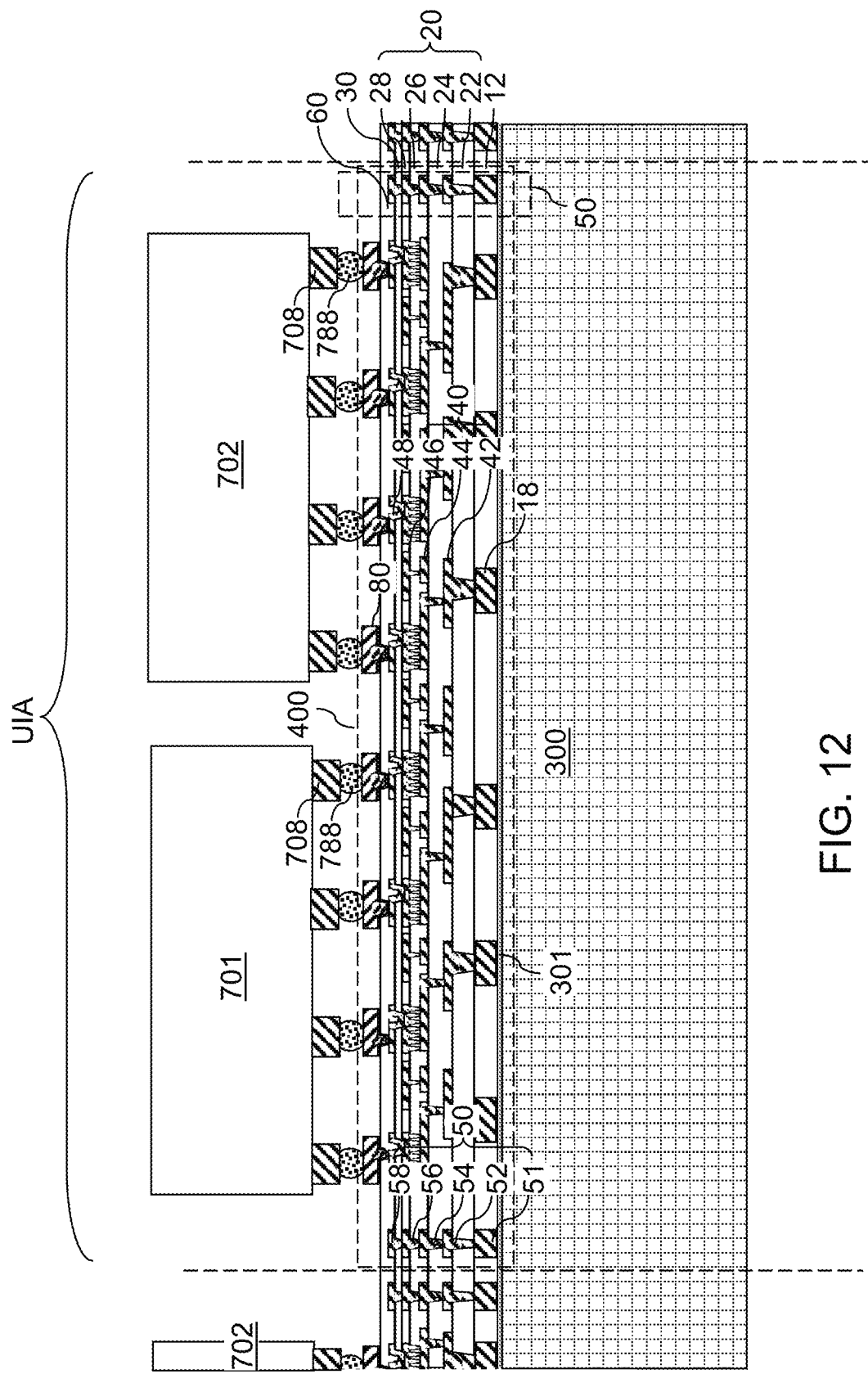
FIG. 12 is a vertical cross-sectional view of the exemplary structure after attaching semiconductor dies to the organic interposers according to an embodiment of the present disclosure.

With reference to FIG. 12, generally, die-side bump structures 80 may be formed over the bonding-level dielectric layer 60 on a respective one of the metallic pad structures 48. An edge seal ring structure 50 may be formed, which comprises an assembly of a package-side metallic ring structure 51, the interconnect-level metallic ring structures (52, 54, 56), and the pad-level metallic ring structure 58. The edge seal ring structure 50 laterally encloses each of the redistribution interconnect structures 40 and each of the metallic pad structures 48. The edge seal ring structure 50 vertically extends through each of the interconnect-level dielectric material layers 20 and the at least one dielectric capping layer 30.

With reference to FIGS. 11A-11D and according to an embodiment of the present disclosure, an organic interposer 400 is provided, which comprises: interconnect-level dielectric material layers 20 embedding redistribution interconnect structures 40; package-side bump structures 18 embedded in a package-side dielectric material layer 12 that is located on a first side of the interconnect-level dielectric material layers 20; at least one dielectric capping layer 30 located on a second side of the interconnect-level dielectric material layers 20; a bonding-level dielectric layer 60 located on the at least one dielectric capping layer 30; metallic pad structures 48 including pad via portions 48V embedded in the at least one dielectric capping layer 30 and pad plate portions 48P embedded in the bonding-level dielectric layer 60; and an edge seal ring structure 50 vertically extending from a first horizontal plane HP1 including bonding surfaces of the package-side bump structures 18 to a second horizontal plane HP2 including distal planar surfaces of the metallic pad structures 48 and comprising a vertical stack of interconnect-level metallic ring structures (52, 54, 56) that are free of aluminum and laterally surrounding the package-side bump structures 18 and each of the redistribution interconnect structures 40.

In one embodiment, the edge seal ring structure 50 comprises a pad-level metallic ring structure 58 having a distal surface 58D within the second horizontal plane HP2. In one embodiment, the pad-level metallic ring structure 58 has a planar surface (which is a bottom surface) located within a third horizontal plane HP3 including an interface between the at least one dielectric capping layer 30 and the interconnect-level dielectric material layers 20. The pad-level metallic ring structure 58 may include a line-level portion 58P located above the horizontal plane including an interface between the at least one dielectric capping layer 30 and the bonding-level dielectric layer 60, and a via-level portion 58V located below the horizontal plane including an interface between the at least one dielectric capping layer 30 and the bonding-level dielectric layer 60.

In one embodiment, the pad-level metallic ring structure 58 comprises copper at an atomic percentage of at least 95%, and may consist essentially of copper. In one embodiment, the pad-level metallic ring structure 58 comprises a line-level portion 58P having a same height as the pad plate portions 48P, and a via-level portion 58V having a same height as the pad via portions 48V.

In one embodiment, the at least one dielectric capping layer 30 comprises an inorganic dielectric material (such as silicon oxide); and at least one of the interconnect-level dielectric material layers 20 comprises an organic polymer material. In one embodiment, the bonding-level dielectric layer 60 comprises a dielectric passivation layer 62 and a bonding-level polymer layer 64. In one embodiment, the dielectric passivation layer 62 comprises a silicon nitride layer.

In one embodiment, the organic interposer 400 comprises die-side bump structures 80. Each of the die-side bump structures 80 comprises a bump pillar portion 80P having a cylindrical shape and contacting a distal surface of the bonding-level dielectric layer 60, and a bump via portion 80V laterally surrounded by the bonding-level dielectric layer 60 and contacting a respective one of the metallic pad structures 48. In one embodiment, each interface between the die-side bump structures 80 and the metallic pad structures 48 is located within the second horizontal plane HP2. In one embodiment, an entire area of the edge seal ring structure 50 may be covered by the bonding-level dielectric layer 60.

FIG. 12 is a vertical cross-sectional view of the exemplary structure after attaching semiconductor dies to the organic interposers according to an embodiment of the present disclosure. At least one semiconductor die (701, 702) may be attached to each organic interposer 400. Each semiconductor die (701, 702) may be bonded to a respective subset of the die-side bump structures 80 within a respective unit interposer area UIA through solder material portions 788. Each semiconductor die (701, 702) may comprise die bump structures 708. In one embodiment, the die bump structures 708 may comprise a two-dimensional array of microbump structures, and each semiconductor die (701, 702) may be attached to the die-side bump structure 80 by C2 bonding, i.e., solder bonding between a pair of microbumps. A C2 bonding process that reflows the solder material portions 788 may be performed after the die bump structures 708 of the semiconductor dies (701, 702) are disposed over the array of solder material portions 788.

The at least one semiconductor die (701, 702) may include any semiconductor die known in the art. In one embodiment, the at least one semiconductor die (701, 702) may include a system-on-chip (SoC) die such as an application processor die. In one embodiment, the at least one semiconductor die (701, 702) may include a plurality of semiconductor dies (701, 702). In one embodiment, the plurality of semiconductor dies (701, 702) may include a first semiconductor die 701 and at least one second semiconductor die 702. In one embodiment, the first semiconductor die 701 may be a central processing unit die, and the at least one second semiconductor die 702 may include a graphic processing unit die. In another embodiment, the first semiconductor die 701 may include a system-on-chip (SoC) die, and the at least one second semiconductor die 702 may include at least one high bandwidth memory (HBM) die, each of which includes a vertical stack of static random access memory dies and provides high bandwidth as defined under JEDEC standards, i.e., standards defined by The JEDEC Solid State Technology Association. The top surfaces of the semiconductor dies (701, 702) that are attached to a same organic interposer 400 may be positioned within a same horizontal plane. Generally, at least one semiconductor die (701, 702) may be attached to the die-side bump structures 80 through at least one array of solder material portions 788.

Figure 13:
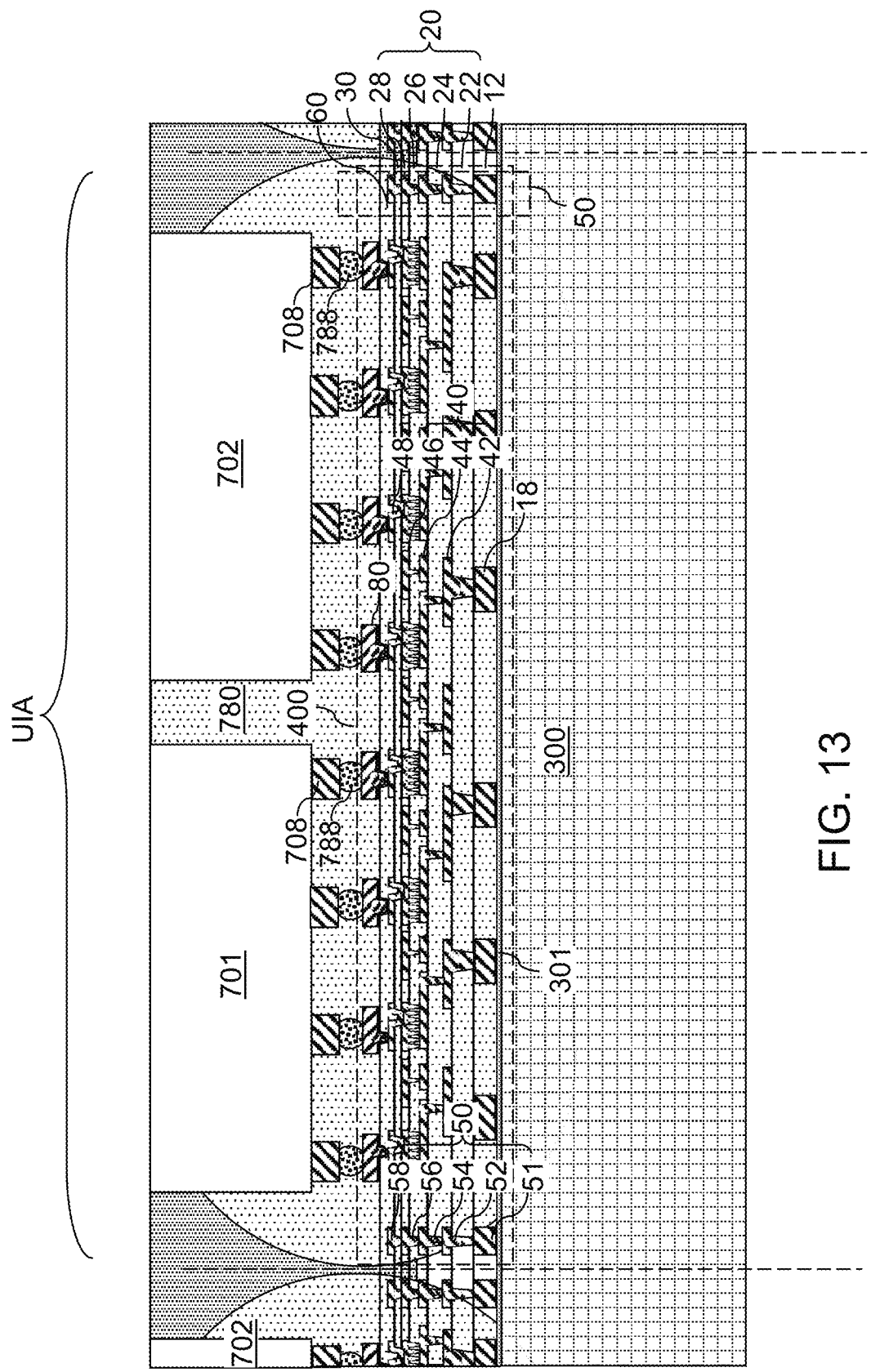
FIG. 13 is a vertical cross-sectional view of the exemplary structure after formation of fan-out wafer-level packages according to an embodiment of the present disclosure.

FIG. 13 is a vertical cross-sectional view of the exemplary structure after formation of fan-out wafer-level packages according to an embodiment of the present disclosure. At least one underfill material portion 780 may be formed around each bonded array of solder material portions 788. Each underfill material portion 780 may be formed by injecting an underfill material around the array of solder material portions 788 after the solder material portions 788 are reflowed. Any known underfill material application method may be used, which may be, for example, the capillary underfill method, the molded underfill method, or the printed underfill method. In one embodiment, a plurality of semiconductor dies (701, 702) may be attached to an organic interposer 400 within each unit interposer area UIA, and a single underfill material portion 780 may continuously extend underneath the plurality of semiconductor dies (701, 702).

An epoxy molding compound (EMC) is applied to the gaps formed between the organic interposers 400 and the semiconductor dies (701, 702). The EMC includes an epoxy-containing compound that may be hardened (i.e., cured) to provide a dielectric material portion having sufficient stiffness and mechanical strength. The EMC may include epoxy resin, hardener, silica (as a filler material), and other additives. The EMC may be provided in a liquid form or in a solid form depending on the viscosity and flowability. Liquid EMC provides better handling, good flowability, less voids, better fill, and less flow marks. Solid EMC provides less cure shrinkage, better stand-off, and less die drift. A high filler content (such as 85% in weight) within an EMC may shorten the time in mold, lower the mold shrinkage, and reduce the mold warpage. Uniform filler size distribution in the EMC may reduce flow marks, and may enhance flowability. The curing temperature of the EMC may be lower than the release (debonding) temperature of the adhesive layer 301. For example, the curing temperature of the EMC may be in a range from 125° C. to 150° C.

The EMC may be cured at a curing temperature to form an EMC matrix that laterally encloses each of the semiconductor dies (701, 702). The EMC matrix includes a plurality of epoxy molding compound (EMC) frames 790 that are laterally adjoined to one another. Each EMC die frame 790 is located within a respective unit interposer area UIA, and laterally surrounds and embeds a respective set of at least one semiconductor die (701, 702), which may be a plurality of semiconductor dies (701, 702). Excess portions of the EMC may be removed from above the horizontal plane including the top surfaces of the semiconductor dies (701, 702) by a planarization process, which may use chemical mechanical planarization.

Figure 14:
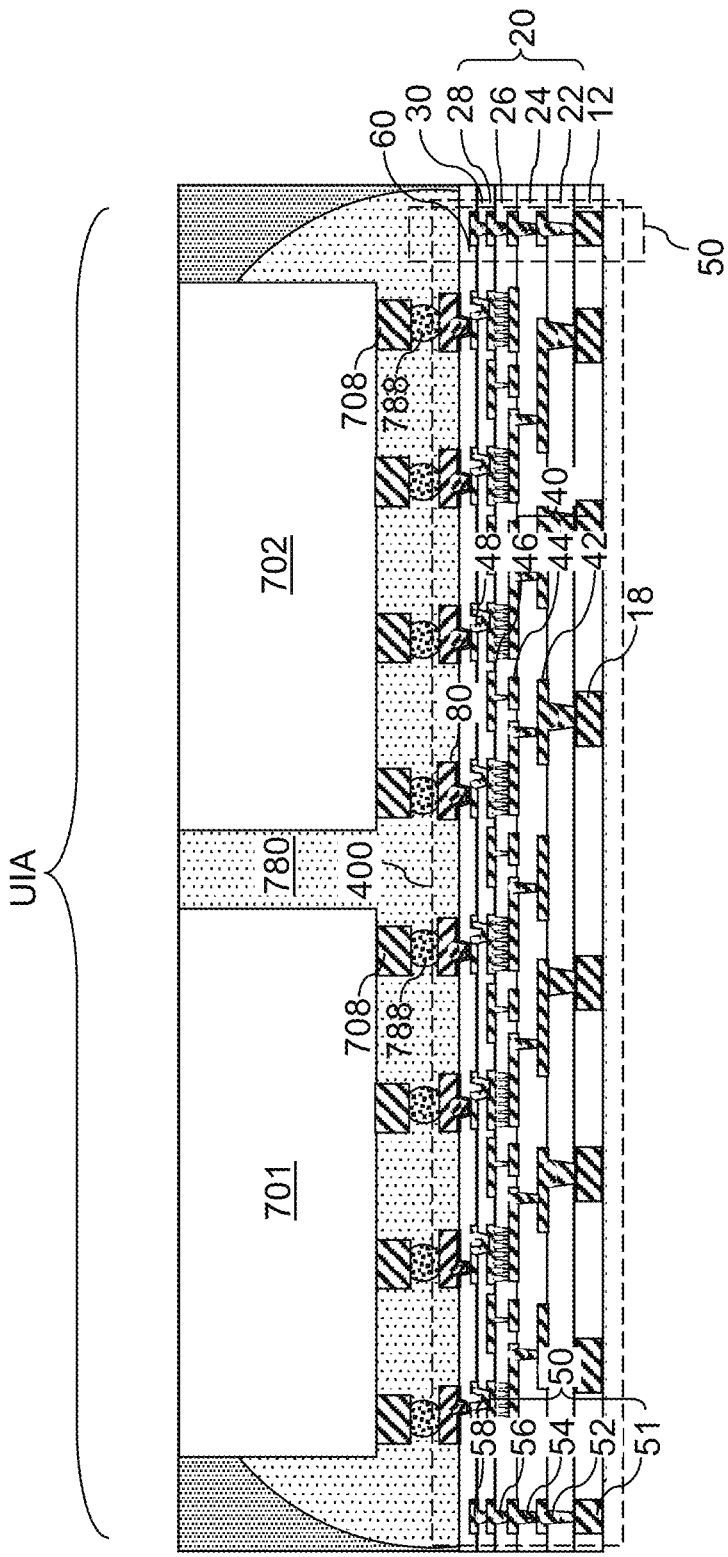
FIG. 14 is a vertical cross-sectional view of the exemplary structure after dicing the fan-out wafer-level packages according to an embodiment of the present disclosure.

FIG. 14 is a vertical cross-sectional view of the exemplary structure after dicing the fan-out wafer-level packages according to an embodiment of the present disclosure. The carrier substrate 300 may be detached from the assembly of the organic interposers 400, the semiconductor dies (701, 702), and the EMC die frames 790. The adhesive layer 301 may be deactivated, for example, by a thermal anneal at an elevated temperature. Embodiments may include an adhesive layer 301 that includes a thermally-deactivated adhesive material. In other embodiments in which the carrier substrate 300 may be transparent, an adhesive layer 301 may include an ultraviolet-deactivated adhesive material.

The assembly of the organic interposers 400, the semiconductor dies (701, 702), and the EMC die frames 790 may be diced along the dicing channels, which are located along the boundaries of the unit interposer areas. Each diced portion of the organic interposers 400, the semiconductor dies (701, 702), and the EMC die frames 790 comprises a fan-out wafer-level package (FOWLP), which includes at least one semiconductor die (701, 702) (which may be a plurality of semiconductor dies), an organic interposer 400, an underfill material portion 780, and an EMC die frame 790. The EMC die frame 790 and the organic interposer 400 may have vertically coincident sidewalls, i.e., sidewalls located within a same vertical plane. In embodiments in which the FOWLP includes a plurality of semiconductor dies (701, 702), the underfill material portion 780 may contact sidewalls of the plurality of semiconductor dies (701, 702). The EMC die frame 790 continuously extends around, and laterally encircles, the at least one semiconductor die (701, 702) within the FOWLP.

Referring collectively to FIGS. 1A-14 and according to an aspect of the present disclosure, a fan-out wafer-level package (FOWLP) comprising an organic interposer 400 and at least one semiconductor die (701, 702) attached to the organic interposer 400 is provided. The organic interposer 400 comprises interconnect-level dielectric material layers 20 embedding redistribution interconnect structures 40; package-side bump structures 18 embedded in a package-side dielectric material layer 12 that is located on a first side of the interconnect-level dielectric material layers 20; at least one dielectric capping layer 30 located on a second side of the interconnect-level dielectric material layers 20; a bonding-level dielectric layer 60 located on the at least one dielectric capping layer 30; an edge seal ring structure 50 comprising a vertical stack of interconnect-level metallic ring structures (52, 54, 56) that are free of aluminum and comprising copper at an atomic percentage greater than 95%, vertically extending through the interconnect-level dielectric material layers 20 and the at least one dielectric capping layer 30, laterally surrounding the package-side bump structures 18 and each of the redistribution interconnect structures 40, and embedded within and covered by the bonding-level dielectric layer 60; and die-side bump structures 80 bonded to the at least one semiconductor die (701, 702). Each of the die-side bump structures 80 comprises a bump pillar portion 80P having a cylindrical shape and contacting a distal surface of the bonding-level dielectric layer 60, and a bump via portion 80V laterally surrounded by the bonding-level dielectric layer 60 and contacting a respective one of the metallic pad structures 48.

In one embodiment, the organic interposer 400 comprises metallic pad structures 48 extending through the at least one dielectric capping layer 30 and embedded in the bonding-level dielectric layer 60, and the edge seal ring structure 50 vertically extends from a first horizontal plane HP1 including bonding surfaces of the package-side bump structures 18 to a second horizontal plane HP2 including distal planar surfaces of the metallic pad structures 48.

In one embodiment, the metallic pad structures 48 include pad via portions 48V embedded in the at least one dielectric capping layer 30 and pad plate portions 48P embedded in the bonding-level dielectric layer 60, and the edge seal ring structure 50 comprises a pad-level metallic ring structure 58 having a distal surface within the second horizontal plane HP2.

In one embodiment, the at least one dielectric capping layer 30 comprises an inorganic dielectric material (such as silicon oxide); at least one of the interconnect-level dielectric material layers 20 comprises an organic polymer material; and the at least one dielectric capping layer 30 comprises a dielectric passivation layer 62 and a bonding-level polymer layer 64.

Figure 15:
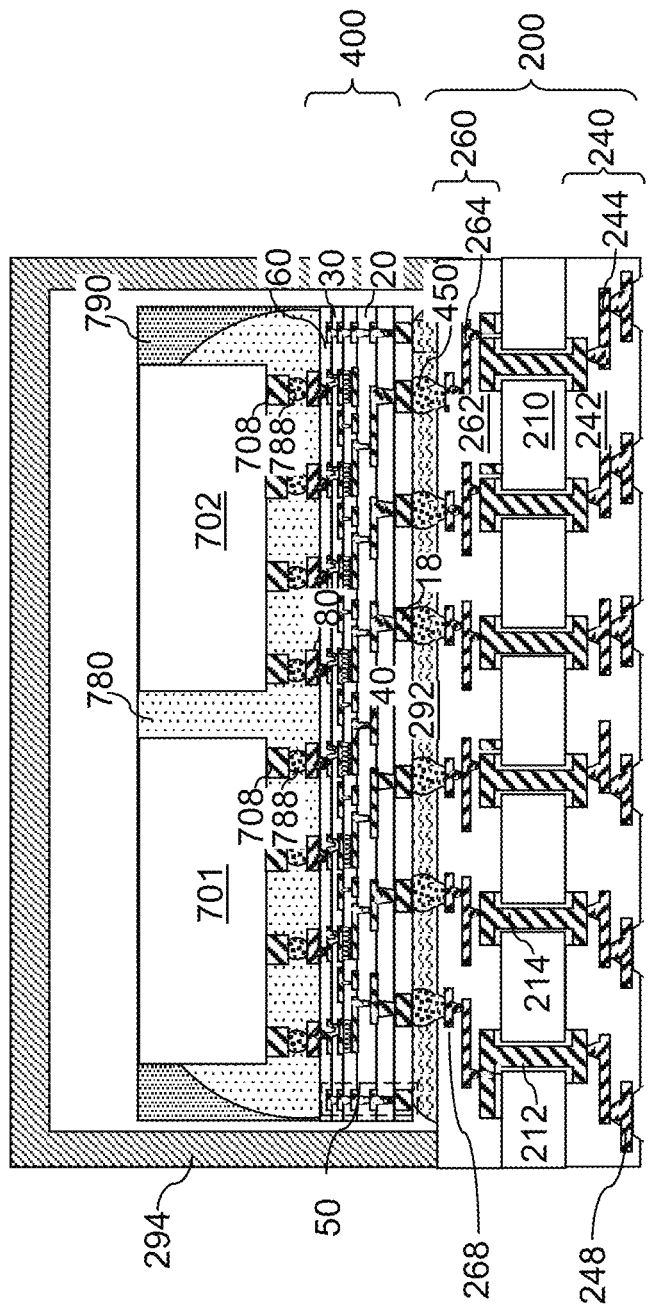
FIG. 15 is a vertical cross-sectional view of the exemplary structure after attaching a package substrate to the fan-out wafer-level package according to an embodiment of the present disclosure.

FIG. 15 is a vertical cross-sectional view of the exemplary structure after attaching a package substrate to the fan-out wafer-level package according to an embodiment of the present disclosure. A package substrate 200 may be provided. The package substrate 200 may be a cored package substrate including a core substrate 210, or a coreless package substrate that does not include a package core. Alternatively, the package substrate 200 may include a system-integrated package substrate (SoIS) including redistribution layers and/or dielectric interlayers, at least one embedded interposer (such as a silicon interposer). Such a system-integrated package substrate may include layer-to-layer interconnections using solder material portions, microbumps, underfill material portions (such as molded underfill material portions), and/or an adhesion film. While the present disclosure is described using an exemplary substrate package, it is understood that the scope of the present disclosure is not limited by any particular type of substrate package and may include a SoIS.

The core substrate 210 may include a glass epoxy plate including an array of through-plate holes. An array of through-core via structures 214 including a metallic material may be provided in the through-plate holes. Each through-core via structure 214 may, or may not, include a cylindrical hollow therein. Optionally, dielectric liners 212 may be used to electrically isolate the through-core via structures 214 from the core substrate 210.

The package substrate 200 may include board-side surface laminar circuit (SLC) 240 and a chip-side surface laminar circuit (SLC) 260. The board-side SLC 240 may include board-side insulating layers 242 embedding board-side wiring interconnects 244. The chip-side SLC 260 may include chip-side insulating layers 262 embedding chip-side wiring interconnects 264. The board-side insulating layers 242 and the chip-side insulating layers 262 may include a photosensitive epoxy material that may be lithographically patterned and subsequently cured. The board-side wiring interconnects 244 and the chip-side wiring interconnects 264 may include copper that may be deposited by electroplating within patterns in the board-side insulating layers 242 or the chip-side insulating layers 262. An array of board-side bonding pads 248 may be electrically connected to the board-side wiring interconnects 244, and may be configured to allow bonding through solder balls. An array of chip-side bonding pads 268 may be electrically connected to the chip-side wiring interconnects 264, and may be configured to allow bonding through C4 solder balls.

The solder material portions 450 attached to the package-side bump structures 18 of an assembly of the organic interposer 400, at least one semiconductor die (701, 702), and the EMC die frame 790 may be disposed on the array of the chip-side bonding pads 268 of the package substrate 200. A reflow process may be performed to reflow the solder material portions 450, thereby inducing bonding between the organic interposer 400 and the package substrate 200. In one embodiment, the solder material portions 450 may include C4 solder balls, and the assembly of the organic interposer 400, the at least one semiconductor die (701, 702), and the EMC die frame 790 may be attached to the package substrate 200 using an array of C4 solder balls. An underfill material portion 292 may be formed around the solder material portions 450 by applying and shaping an underfill material. Optionally, a stabilization structure 294, such as a cap structure or a ring structure, may be attached to the assembly of the organic interposer 400, the at least one semiconductor die (701, 702), the EMC die frame 790, and the package substrate 200 to reduce deformation of the assembly during subsequent processing steps and/or during usage of the assembly.

Figure 16:
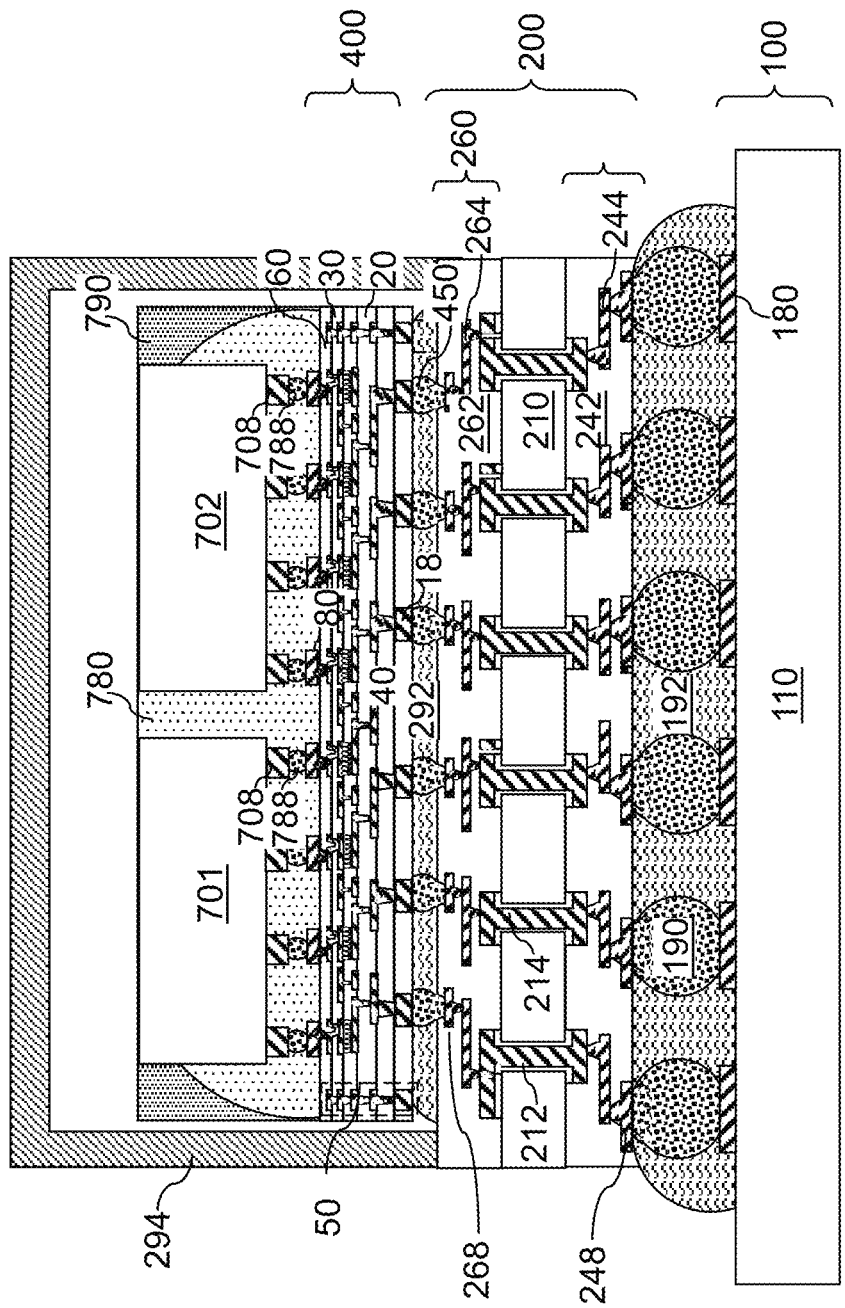
FIG. 16 is a vertical cross-sectional view of the exemplary structure after attaching the package substrate to a printed circuit board (PCB) according to an embodiment of the present disclosure.

FIG. 16 is a vertical cross-sectional view of the exemplary structure after attaching the package substrate to a printed circuit board (PCB) according to an embodiment of the present disclosure. Referring to FIG. 16, a printed circuit board (PCB) 100 including a PCB substrate 110 and PCB bonding pads 180 may be provided. The PCB 100 includes a printed circuitry (not shown) at least on one side of the PCB substrate 110. An array of solder joints 190 may be formed to bond the array of board-side bonding pads 248 to the array of PCB bonding pads 180. The solder joints 190 may be formed by disposing an array of solder balls between the array of board-side bonding pads 248 and the array of PCB bonding pads 180, and by reflowing the array of solder balls. An underfill material portion 192 may be formed around the solder joints 190 by applying and shaping an underfill material. The package substrate 200 is attached to the PCB substrate 100 through the array of solder joints 190.

Figure 17:
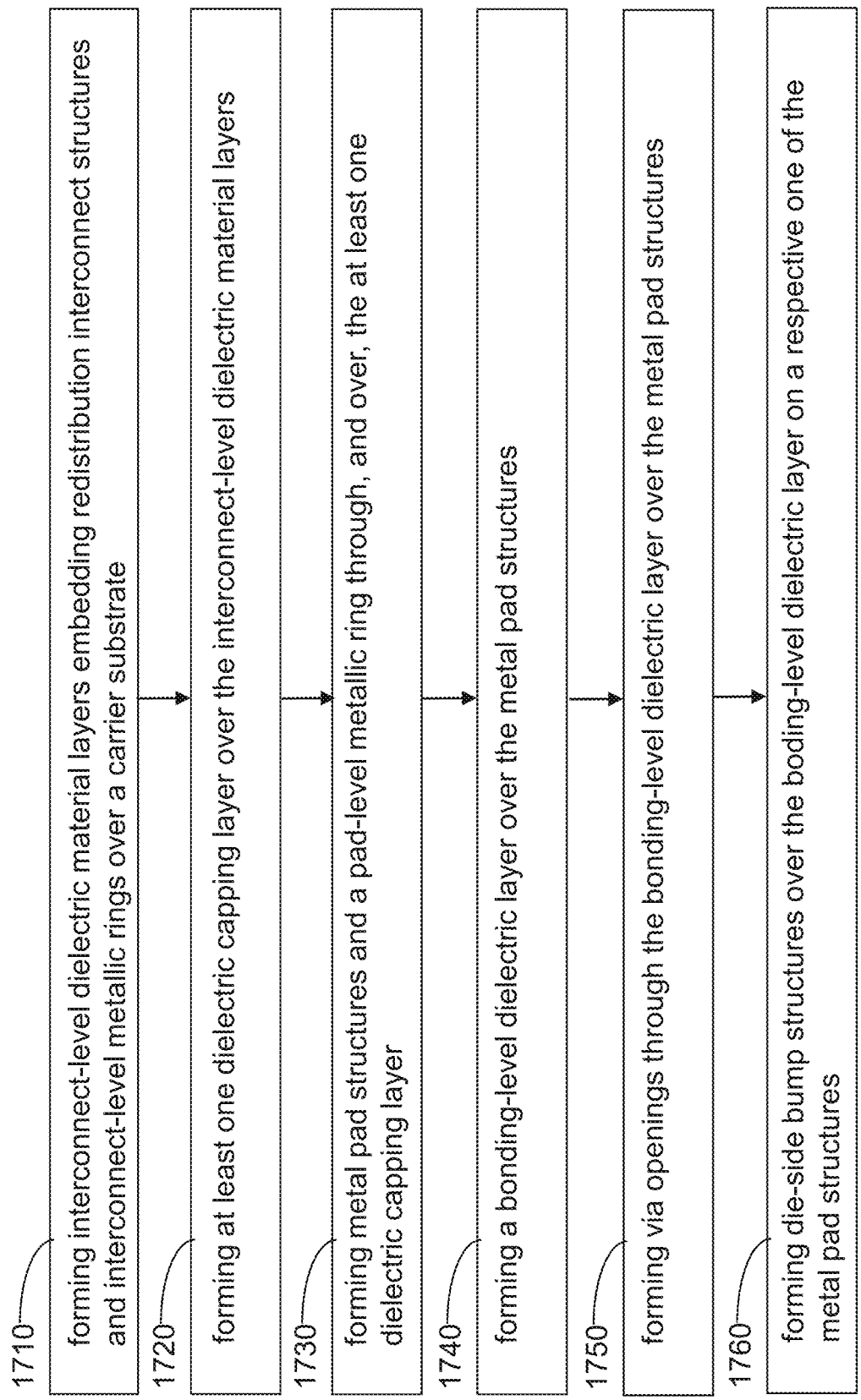
FIG. 17 is a flowchart illustrating steps for forming an organic interposer according to an embodiment of the present disclosure.

Referring to FIG. 17, a flowchart illustrating steps for forming an organic interposer 400 of embodiments of the present disclosure is illustrated. Referring to step 1710 and FIGS. 1A-1D, interconnect-level dielectric material layers 20 embedding redistribution interconnect structures 40 and interconnect-level metallic ring structures (52, 54, 56) are formed over a carrier substrate 300. The interconnect-level metallic ring structures (52, 54, 56) laterally surround the redistribution interconnect structures 40. Referring to step 1720 and FIGS. 2A and 2B, at least one dielectric capping layer 30 may be formed over the interconnect-level dielectric material layers 20. Referring to step 1730 and FIGS. 3A-8B, metallic pad structures 48 and a pad-level metallic ring structure 58 may be formed through, and over, the at least one dielectric capping layer 30. Referring to step 1740 and FIGS. 9A-10B, a bonding-level dielectric layer 60 may be formed over the metallic pad structures 48. Referring step 1750 and FIGS. 10A and 10B, via openings 79 may be formed through the bonding-level dielectric layer 60 over the metallic pad structures 48. Referring to step 1760 and FIGS. 11A-11D, die-side bump structures 80 may be formed over the bonding-level dielectric layer 60 on a respective one of the metallic pad structures 48. An edge seal ring structure 50 is provided, which comprises an assembly of the pad-level metallic ring structure 58 and the interconnect-level metallic ring structures (52, 54, 56), and laterally encloses each of the redistribution interconnect structures 40 and each of the metallic pad structures 48, and vertically extends through each of the interconnect-level dielectric material layers 20 and the at least one dielectric capping layer 30.

The various structures and methods of the present disclosure may be used to provide a copper-based edge seal ring structure 50 that does not require use of aluminum. The combination of the copper-based edge seal ring structure 50, the package-side silicon nitride layer 122 (which may comprise a silicon nitride layer), the dielectric passivation layer 62, the package-side bump structures 18, and the die-side bump structures 80 may provide a contiguous set of diffusion blocking structures that encapsulates the redistribution interconnect structures 40 and the interconnect-level dielectric material layers 20, and thus, protects the redistribution interconnect structures 40 and the interconnect-level dielectric material layers 20 from ingress of moisture, hydrogen, and/or contaminants. The combination of the copper-based edge seal ring structure 50, the package-side silicon nitride layer 122 (which may comprise a silicon nitride layer), the dielectric passivation layer 62, the package-side bump structures 18, and the die-side bump structures 80 provides a contiguous seal structure without any opening therethrough.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A bonded assembly comprising and interposer and at least one semiconductor die, wherein the interposer comprises:

interconnect-level dielectric material layers embedding redistribution interconnect structures, wherein the interconnect-level dielectric material layers comprise organic polymer materials;

package-side bump structures embedded in a package-side dielectric material layer that is located on a first side of the interconnect-level dielectric material layers, wherein the package-side dielectric material layer comprises a package-side silicon nitride layer, and is in direct contact with a bottommost organic polymer material among the organic polymer materials, wherein bonding surfaces of the package-side bump structures are located within a first horizontal plane within which an entirety of a horizontal surface of the package-side dielectric material layer is located;

at least one dielectric capping layer located on a second side of the interconnect-level dielectric material layers;

a bonding-level dielectric layer located on the at least one dielectric capping layer;
metallic pad structures including pad via portions embedded in the at least one dielectric capping layer and pad plate portions embedded in the bonding-level dielectric layer, wherein distal planar surfaces of the metallic pad structures that are most distal from the first horizontal plane are located within a second horizontal plane;
die-side bump structures located on the distal planar surfaces of the metallic pad structures; and
an edge seal ring structure vertically extending from the first horizontal plane to the second horizontal plane and comprising a vertical stack of metallic ring structures that are free of aluminum and laterally surrounding the package-side bump structures and each of the redistribution interconnect structures, wherein the vertical stack of metallic ring structures comprises a package-side metallic ring structure that is embedded within the package-side dielectric material layer such that inner sidewalls of the package-side metallic ring structure contact an inner portion of the package-side dielectric material layer that is laterally surrounded by the package-side metallic ring structure, and outer sidewalls of the package-side metallic ring structure contact an outer portion of the package-side dielectric material layer that laterally surrounds the package-side metallic ring structure,
and wherein the bonded assembly further comprises:
first solder material portions bonded to the package-side bump structures of the interposer;
a first underfill material portion in direct contact with the first solder material portions, in direct contact with the horizontal surface of the package-side dielectric material layer, and in direct contact with a bottom surface of a bottommost metallic ring structure within the vertical stack of metallic ring structures within the first horizontal plane, the bottom surface of the bottommost metallic ring structure not being in direct contact with any solder material; and
second solder material portions bonded to the die-side bump structures and the at least one semiconductor die and located on an opposite side of the first solder material portions.

2. The bonded assembly of claim 1, wherein the edge seal ring structure comprises a pad-level metallic ring structure having a distal surface within the second horizontal plane.

3. The bonded assembly of claim 2, wherein the pad-level metallic ring structure has a planar surface located within a horizontal plane including an interface between the at least one dielectric capping layer and the interconnect-level dielectric material layers.

4. The bonded assembly of claim 1, wherein:
no other metallic structure is located outside the edge seal ring structure within the interposer; and
an entire area of the edge seal ring structure is covered by a polymer material within the bonding-level dielectric layer.

5. The bonded assembly of claim 1, wherein the bottommost organic polymer material consists of a dielectric polymer material selected from polyimide (PI), benzocyclobutene (BCB), or polybenzobisoxazole (PBO).

6. The bonded assembly of claim 5, wherein the bonding-level dielectric layer comprises sidewalls which are surfaces of a photosensitive polymer material, and are located entirely within a respective vertical plane including a respective subset of sidewalls of the interconnect-level dielectric material layers.

7. The bonded assembly of claim 5, wherein an entirety of the bottom surface of the bottommost metallic ring structure is in direct contact with the first underfill material portion.

8. The bonded assembly of claim 5, further comprising:
a package substrate that is bonded to the interposer, wherein the first solder material portion is in direct contact with the packaging substrate; and
a stabilization structure that is attached to the packaging substrate, wherein a gap that is free of any solid phase material is present between the interposer and the stabilization structure such that sidewalls of the interconnect-level dielectric material layers, sidewalls of the at least one dielectric capping layer, and sidewalls of the bonding-level dielectric layer are physically exposed to the gap.

9. The bonded assembly of claim 8, wherein:
the bottommost metallic ring structure is more proximal to the packaging substrate than the metallic pad structures are to the packaging substrate; and
the bonding-level dielectric layer is more distal from the packaging substrate than the bottommost metallic ring structure is from the packaging substrate.

10. The bonded assembly of claim 9, wherein the metallic pad structures are more distal from the packaging substrate than the interconnect-level dielectric material layers are from the packaging substrate.

11. The bonded assembly of claim 5, further comprising:
second solder material portions bonded to the metallic pad structures; and
a second underfill material portion in direct contact with the second solder material portions and in direct contact with a polymer material within the bonding-level dielectric layer,
wherein each of the edge seal ring structures is vertically spaced from the second underfill material portion by a vertical spacing that is not greater than, and is not less than, a vertical distance between a topmost surface of the bonding-level dielectric layer and the second horizontal plane.

12. The bonded assembly of claim 1, wherein:
the bottommost metallic ring structure and the package-side bump structures have a same height and a same material composition; and
each of the bottommost metallic ring structure and the package-side bump structures comprises sidewalls that are in contact with the bottommost organic polymer material.

13. The bonded assembly of claim 1, further comprising:
at least one semiconductor die that is bonded to the interposer through second solder material portions that are bonded to the metallic pad structures;
a second underfill material portion laterally surrounding the second solder material portions and contacting a first horizontal surface segment of the bonding-level dielectric layer; and
a molding compound die frame that laterally surrounds the at least one semiconductor die and in direct contact with a second horizontal surface segment of the bonding-level dielectric layer.

14. The bonded assembly of claim 13, wherein:
the second horizontal surface segment of the bonding-level dielectric layer is located within a horizontal plane including the first horizontal surface segment of the bonding-level dielectric layer; and
each outer sidewall of the interconnect-level dielectric material layers is located entirely within a vertical plane including a respective outer sidewall of the molding compound die frame.

15. The bonded assembly of claim 1, wherein:
the at least one dielectric capping layer consists of at least one inorganic dielectric material;
a topmost surface of the topmost metallic ring structure within the vertical stack of metallic ring structures is located entirely within the second horizontal plane; and
a horizontal interface between a topmost organic polymer material and the at least one inorganic dielectric material is located entirely within an additional horizontal plane including a bottom surface of the topmost metallic ring structure within the vertical stack of metallic ring structures, the additional horizontal plane being more proximal to the first horizontal plane than the second horizontal plane is to the first horizontal plane.

16. A fan-out wafer-level package (FOWLP) comprising an interposer and at least one semiconductor die attached to the interposer, wherein the interposer comprises:
interconnect-level dielectric material layers embedding redistribution interconnect structures, wherein the interconnect-level dielectric material layers comprise organic polymer materials;
package-side bump structures embedded in a package-side dielectric material layer that is located on a first side of the interconnect-level dielectric material layers, wherein the package-side dielectric material layer comprises a package-side silicon nitride layer, and is in direct contact with a bottommost organic polymer material among the organic polymer materials, wherein bonding surfaces of the package-side bump structures are located within a first horizontal plane within which an entirety of a horizontal surface of the package-side dielectric material layer is located;
at least one dielectric capping layer located on a second side of the interconnect-level dielectric material layers;
a bonding-level dielectric layer located on the at least one dielectric capping layer;
an edge seal ring structure comprising a vertical stack of metallic ring structures that are free of aluminum and comprising copper at an atomic percentage greater than 95%, vertically extending through the interconnect-level dielectric material layers and the at least one dielectric capping layer, laterally surrounding the package-side bump structures and each of the redistribution interconnect structures, and embedded within and covered by the bonding-level dielectric layer, and the vertical stack of metallic ring structures comprises a package-side metallic ring structure that is embedded within the package-side dielectric material layer such that inner sidewalls of the package-side metallic ring structure contact an inner portion of the package-side dielectric material layer that is laterally surrounded by the package-side metallic ring structure, and outer sidewalls of the package-side metallic ring structure contact an outer portion of the package-side dielectric material layer that laterally surrounds the package-side metallic ring structure; and
die-side bump structures bonded to the at least one semiconductor die, wherein each of the die-side bump structures comprises:
a bump pillar portion having a cylindrical shape and contacting a distal surface of the bonding-level dielectric layer; and
a bump via portion laterally surrounded by the bonding-level dielectric layer and contacting a respective one of the metallic pad structures,
and wherein the FOWLP further comprises:
first solder material portions bonded to the package-side bump structures of the interposer;
a first underfill material portion in direct contact with the first solder material portions, in direct contact with the horizontal surface of the package-side dielectric material layer, and in direct contact with a bottom surface of a bottommost metallic ring structure within the vertical stack of metallic ring structures within the first horizontal plane, the bottom surface of the bottommost metallic ring structure not being in direct contact with any solder material; and
second solder material portions bonded to the die-side bump structures and the at least one semiconductor die and located on an opposite side of the first solder material portions.

17. The FOWLP of claim 16, wherein:
the interposer comprises metallic pad structures extending through the at least one dielectric capping layer and embedded in the bonding-level dielectric layer; and
the edge seal ring structure vertically extends from the first horizontal plane including bonding surfaces of the package-side bump structures to a second horizontal plane including distal planar surfaces of the metallic pad structures.

18. The FOWLP of claim 16, wherein:
the at least one dielectric capping layer comprises an inorganic dielectric material;
at least one of the interconnect-level dielectric material layers comprises an organic polymer material; and
the at least one dielectric capping layer comprises a dielectric passivation layer and a bonding-level polymer layer.

19. A bonded assembly comprising and interposer and at least one semiconductor die, wherein the interposer comprises:
interconnect-level dielectric material layers embedding redistribution interconnect structures, wherein the interconnect-level dielectric material layers comprise organic polymer materials;
package-side bump structures embedded in a package-side dielectric material layer that is located on a first side of the interconnect-level dielectric material layers, wherein the package-side dielectric material layer comprises a package-side silicon nitride layer, and is in direct contact with a bottommost organic polymer material among the organic polymer materials, wherein bonding surfaces of the package-side bump structures are located within a first horizontal plane within which an entirety of a horizontal surface of the package-side dielectric material layer is located;
at least one dielectric capping layer located on the interconnect-level dielectric material layers;
a bonding-level dielectric layer located on the at least one dielectric capping layer;
metallic pad structures including pad via portions embedded in the at least one dielectric capping layer and pad plate portions embedded in the bonding-level dielectric layer, wherein distal planar surfaces of the metallic pad structures that are most distal from the first horizontal plane are located within a second horizontal plane;
die-side bump structures located on the distal planar surfaces of the metallic pad structures; and
an edge seal ring structure comprising a vertical stack of metallic ring structures and laterally surrounding the package-side bump structures and each of the redistribution interconnect structures, wherein no metallic structure is embedded outside of the vertical stack of metallic ring structures within the interposer, and the vertical stack of metallic ring structures comprises a package-side metallic ring structure that is embedded within the package-side dielectric material layer such that inner sidewalls of the package-side metallic ring structure contact an inner portion of the package-side dielectric material layer that is laterally surrounded by the package-side metallic ring structure, and outer sidewalls of the package-side metallic ring structure contact an outer portion of the package-side dielectric material layer that laterally surrounds the package-side metallic ring structure, and wherein the bonded assembly further comprises:
first solder material portions bonded to the package-side bump structures of the interposer;
a first underfill material portion in direct contact with the first solder material portions, in direct contact with a bottommost organic polymer material among the organic polymer materials within the interconnect level dielectric material layers the horizontal surface of the package-side dielectric material layer, and in direct contact with a bottom surface of a bottommost metallic ring structure within the vertical stack of metallic ring structures within the first horizontal plane, the bottom surface of the bottommost metallic ring structure not being in direct contact with any solder material; and
second solder material portions bonded to the die-side bump structures and the at least one semiconductor die and located on an opposite side of the first solder material portions.

20. The bonded assembly of claim 19, wherein the edge seal ring structure comprises a pad-level metallic ring structure having a distal surface within the second horizontal plane.

* * * * *